US008080920B2

(12) United States Patent
Andosca et al.

(10) Patent No.: US 8,080,920 B2
(45) Date of Patent: Dec. 20, 2011

(54) PIEZOELECTRIC VIBRATIONAL ENERGY HARVESTING SYSTEMS INCORPORATING PARAMETRIC BENDING MODE ENERGY HARVESTING

(75) Inventors: Robert G. Andosca, Macedon, NY (US); Junru Wu, S. Burlington, VT (US)

(73) Assignee: The University of Vermont and State Agricultural College, Burlington, VT (US)

( * ) Notice: Subject to any disclaimer, the term of this patent is extended or adjusted under 35 U.S.C. 154(b) by 0 days.

(21) Appl. No.: 12/532,322

(22) PCT Filed: Mar. 21, 2008

(86) PCT No.: PCT/US2008/057865
§ 371 (c)(1),
(2), (4) Date: Sep. 21, 2009

(87) PCT Pub. No.: WO2008/116173
PCT Pub. Date: Sep. 25, 2008

(65) Prior Publication Data
US 2010/0072759 A1 Mar. 25, 2010

Related U.S. Application Data

(60) Provisional application No. 60/896,077, filed on Mar. 21, 2007.

(51) Int. Cl.
*H01L 41/113* (2006.01)
(52) U.S. Cl. ...................................... 310/339
(58) Field of Classification Search ............ 310/339
See application file for complete search history.

(56) References Cited

U.S. PATENT DOCUMENTS

| 3,234,787 | A | * | 2/1966 | Ruge ...................... 73/862.622 |
| 3,457,463 | A | | 7/1969 | Balamuth |
| 5,402,684 | A | * | 4/1995 | Engeler et al. ................... 73/794 |
| 5,481,184 | A | * | 1/1996 | Jacobsen ........................ 324/106 |
| 5,581,144 | A | | 12/1996 | Corl |
| 5,744,947 | A | * | 4/1998 | Jacobsen et al. .............. 324/106 |

(Continued)

FOREIGN PATENT DOCUMENTS

EP  1843405 A2  10/2007
(Continued)

OTHER PUBLICATIONS

A.B. Pippard, The Physics of Vibration, Parametric Excitation, Published by the Press Syndicate of the University of Cambridge, 1989, pp. 285-305.

(Continued)

*Primary Examiner* — Thomas Dougherty
(74) *Attorney, Agent, or Firm* — Downs Rachlin Martin PLLC

(57) ABSTRACT

Vibrational energy harvesting (VEH) structures that include resonant beams each having a fundamental resonance frequency and a parametric mode frequency and including at least one piezoelectric layer for generating electrical charge in response to each of fundamental-resonance excitation and parametric-mode excitation of that beam. Circuitry is provided for harvesting the electrical charge from the resonant beam. In some embodiments, the parametric mode frequency of the beam is tuned to be close to its fundamental resonance frequency so as to increase the effective bandwidth of a VEH structure. The effective bandwidth of a VEH structure can be further increased by tuning ones of multiple parametric-mode-enabled resonant beams to slightly different fundamental resonance frequencies and parametric mode frequencies.

37 Claims, 14 Drawing Sheets

U.S. PATENT DOCUMENTS

| | | | |
|---|---|---|---|
| 5,757,993 A * | 5/1998 | Abe | 385/34 |
| 5,933,002 A * | 8/1999 | Jacobsen et al. | 324/99 R |
| 6,407,484 B1 | 6/2002 | Oliver | |
| 6,437,490 B1 | 8/2002 | Yanagisawa | |
| 6,510,738 B1 | 1/2003 | Lee | |
| 6,531,861 B1 * | 3/2003 | Jacobsen et al. | 324/106 |
| 6,655,035 B2 | 12/2003 | Ghandi | |
| 6,771,007 B2 | 8/2004 | Tanielian | |
| 6,858,970 B2 | 2/2005 | Malkin et al. | |
| 6,922,474 B2 * | 7/2005 | Hayama | 381/94.5 |
| 6,954,025 B2 | 10/2005 | Nishida | |
| 6,984,902 B1 | 1/2006 | Huang et al. | |
| 7,057,330 B2 | 6/2006 | Buhler et al. | |
| 7,116,036 B2 | 10/2006 | Balasubramaniam | |
| 7,132,757 B2 | 11/2006 | Steigerwald | |
| 7,183,699 B2 | 2/2007 | Maruyama | |
| 7,205,867 B2 | 4/2007 | Lutz et al. | |
| 7,224,105 B2 | 5/2007 | Onishi | |
| 7,227,432 B2 | 6/2007 | Lutz | |
| 7,235,914 B2 | 6/2007 | Richards | |
| 7,365,455 B2 | 4/2008 | Hamel et al. | |
| 2004/0041498 A1 | 3/2004 | Sakai | |
| 2004/0075363 A1 | 4/2004 | Malkin et al. | |
| 2004/0221658 A1 * | 11/2004 | Jacobsen | 73/849 |
| 2005/0052097 A1 * | 3/2005 | Tanaka et al. | 310/339 |
| 2005/0057123 A1 | 3/2005 | Deng | |
| 2006/0007514 A1 | 1/2006 | Desai | |
| 2006/0017353 A1 | 1/2006 | Sakai | |
| 2006/0175937 A1 | 8/2006 | Clingman | |
| 2006/0186762 A1 | 8/2006 | Sugiura | |
| 2007/0114890 A1 | 5/2007 | Churchill | |
| 2007/0125161 A1 | 6/2007 | Bryzek et al. | |
| 2007/0125176 A1 | 6/2007 | Liu | |
| 2007/0145861 A1 | 6/2007 | Tanner | |
| 2007/0188053 A1 | 8/2007 | Stark | |
| 2007/0245815 A1 | 10/2007 | Proksch | |
| 2007/0284969 A1 | 12/2007 | Xu | |
| 2008/0036617 A1 | 2/2008 | Arms | |
| 2008/0074002 A1 | 3/2008 | Priya et al. | |
| 2008/0100182 A1 * | 5/2008 | Chang et al. | 310/339 |

FOREIGN PATENT DOCUMENTS

| | | |
|---|---|---|
| WO | 0073821 A1 | 12/2000 |
| WO | 03096444 A2 | 11/2003 |
| WO | 2006046937 A1 | 5/2006 |
| WO | 2006046989 A1 | 5/2006 |
| WO | 2006102437 A2 | 9/2006 |
| WO | 2007118277 A1 | 10/2007 |

OTHER PUBLICATIONS

International Search Report and Written Opinion dated Jun. 25, 2008 in connection with related International Application No. PCT/US08/57865, filed Mar. 21, 2008, Inventors Robert G. Andosca and Junru Wu.

Extended European Search Report dated Mar. 7, 2011 in connection with related Application No. EP 08732677.3, filed Mar. 21, 2008, entitled "Piezoelectric Vibrational Energy Harvesting Systems Incorporating Parametric Bending Mode Energy Harvesting," The University of Vermont and State Agricultural College.

Singapore Search and Examination Report dated Jan. 17, 2011 in connection with related Singapore Patent Application No. 200905395-0, filed Mar. 21, 2008, entitled "Piezoelectric Vibrational Energy Harvesting Systems Incorporating Parametric Bending Mode Energy Harvesting," The University of Vermont and State Agricultural College.

Lu et al., "Modeling and analysis of micro piezoelectric power generators for micro-electromechanical-systems applications," Institute of Physics Publishing, p. 57-63 (2004).

Xia et al., "Self-Powered Wireless Sensor System using MEMS Piezoelectric Micro Power Generator," IEEE 5th Conference on Sensors, p. 6-9 (2006).

Dogheche et al., "Piezoelectric Micro-machined Ultrasonic Transducer (pMUT) for Energy harvesting," IEEE Ultrasonics Symposium, p. 939-942 (2005).

Shu et al., "Analysis of power output for piezoelectric energy harvesting systems," Institute of Physics Publishing Ltd., p. 1499-1512 (2006).

* cited by examiner

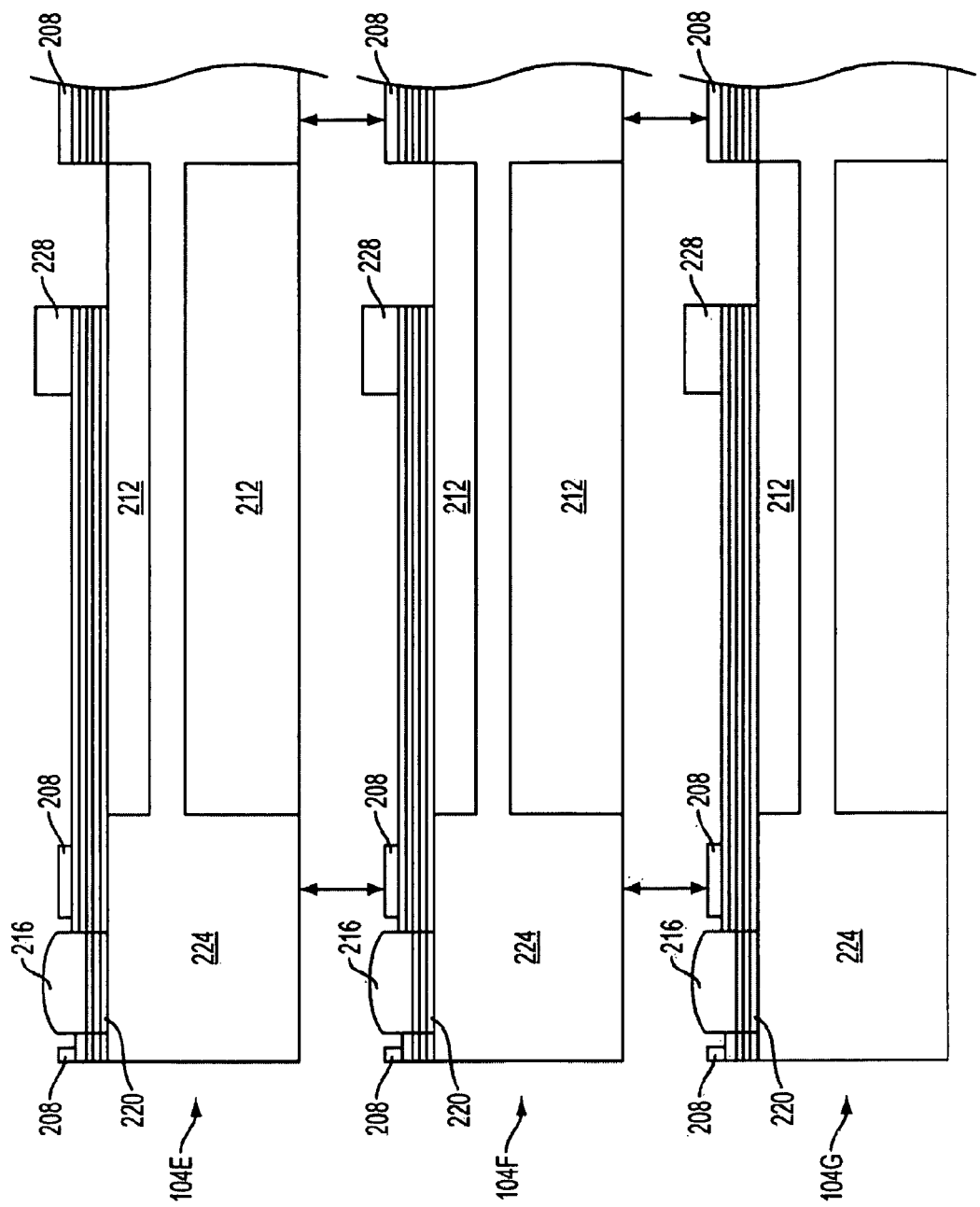

PIEZOELECTRIC VIBRATIONAL ENERGY HARVESTING SYSTEMS INCORPORATING PARAMETRIC BENDING MODE ENERGY HARVESTING

RELATED APPLICATION DATA

This application claims the benefit of priority of U.S. Provisional Patent Application Ser. No. 60/896,077, filed on Mar. 21, 2007, and titled "MEMS-Based Vibrational Power Scavenger," which is incorporated by reference herein in its entirety.

FIELD OF THE INVENTION

The present invention generally relates to the field of vibrational energy scavenging. In particular, the present invention is directed to piezoelectric vibrational energy harvesting systems incorporating parametric bending mode energy harvesting.

BACKGROUND

Over the last quarter-century there has been a drastic increase in the level of integration of integrated circuits (ICs). At the same time, there has been a corresponding significant decrease in the feature size of ICs. For example, the width of a MOSFET (metal-oxide-semiconductor field-effect transistor) gate is presently on the order of 45 nm and is projected to be 18 nm in 2010. This is less than $1/500$ the width of a human hair. IC components have not only dramatically reduced in size, but have also reduced in power consumption. ICs are typically made using CMOS (complementary metal-oxide semiconductor) circuitry, which is made of dual n-FET and p-FET devices. CMOS circuitry consumes much less power than either purely nMOS or purely pMOS circuitry.

Reduction in both size and power consumption of ICs has led to the recent proliferation of wireless IC technology, which was not available just a decade ago. Today, there is a diversity of devices using low-power wireless circuits, including laptop computers, cell phones, MP3 players, smart phones, telephony headsets, headphones, routers, gaming controllers, mobile Internet adaptors, and spy cameras, to name just a few. Of course, each of these devices requires some sort of standalone power supply to work. Typically power supplies for these devices are electrical batteries, often replaceable batteries.

A wireless technology field of significant current interest, and that is the target for much research, is the field of wireless sensor networks. Indeed, researchers envision the future to include a widespread adoption of wireless sensor networks (WSNs). In WSNs, wireless sensors will be distributed throughout a particular environment to form an ad-hoc network or mesh that relays measurement data to a central hub. The particular environment could be any one of an automobile, an aircraft, a factory, and a building, among many others. A WSN will comprise several to tens of thousands wireless sensor nodes that will operate using multi-hop transmissions over short distances. Each wireless node will generally include a sensor, wireless electronics and a power source. The result will be the creation of an intelligent environment responding to its conditions and inhabitants, if any.

A wireless sensor node, like the other wireless devices mentioned above, needs some sort of standalone electrical power supply to provide power to the electronics aboard that node. Conventional batteries, such as lithium-ion batteries, zinc-air batteries, lithium batteries, alkaline batteries, nickel-metal-hydride batteries and nickel-cadmium batteries, could be used. However, for wireless sensor nodes designed to function beyond the typical lifetime of such batteries, at some point the batteries would have to be replaced. This could cause significant problems and expense depending on the number of nodes at issue and the accessibility of those nodes, not to mention the need to dispose of the batteries. Consequently, alternatives to batteries and other types of power supplies needing periodic attention, such as micro-size fuel cells, will be desirable for many WSNs.

Such alternative standalone power supplies would typically rely on scavenging (or "harvesting") of energy from the ambient environment of a wireless sensor node. For example, if the wireless sensor node is exposed to sufficient light, the alternative standalone power supply could include photoelectric or solar cells. Alternatively, if the wireless sensor node is exposed to sufficient air movement, the alternative power supply could include a micro-turbine for harvesting power from the moving air. Other alternative standalone power supplies could also be based on temperature fluctuations, pressure fluctuations or other environmental influences.

However, there will be many instances when the ambient environment does not include sufficient amounts of light, air movement, temperature fluctuation and pressure variation to provide enough power to power a particular wireless sensor node. However, the sensor node may be subjected to fairly predictable and/or constant vibrations, for example, emanating from the structure supporting the node or to which the node is attached. In this case, a vibrational energy scavenger (or harvester) that essentially converts vibrational energy into electrical energy can be used.

A particular type of vibrational energy harvester utilizes resonant beams that incorporate a piezoelectric material that generates electrical charge when strained during resonance of the beams caused by ambient vibrations (driving forces). One shortcoming of many conventional piezoelectric vibrational energy harvesters (PVEHs) is that they are minimally dampened devices having high quality factors (Q). Thus, they are effective over only very small bandwidths of vibrational frequency. This becomes problematic under any one or more of a variety of circumstances, such as when the wireless sensor node is subjected to temperature variations that change the tuning of the PVEH, when the frequency of the ambient vibrations varies over time and when the manufacturing methods used to make the PVEH cause variation in the as-built tuning of the PVEH.

SUMMARY OF THE DISCLOSURE

One implementation of the present invention is a vibrational energy harvester. The vibration energy harvester includes: a resonator beam having transverse cross-sectional properties, a fundamental resonance frequency in a first bending direction and a parametric mode frequency in a second bending direction perpendicular to said first bending direction, wherein said cross-sectional properties are selected to tune said fundamental resonance frequency to a first desired frequency and to tune said parametric mode frequency to a second desired frequency, said resonant beam including piezoelectric material for generating electrical energy in response to bending of said resonator beam in each of said first and second bending directions.

Another implementation of the present invention is a vibrational energy harvesting unit. The vibrational energy harvesting unit includes: a plurality of piezoelectric vibrational energy harvesting (PVEH) modules electrically connected with one another, wherein each of said PVEH modules includes a plurality of parametric mode enabled PVEH beams each configured to harvest electrical charge from each of fundamental resonance excitation and parametric mode excitation.

Yet another implementation of the present invention is a wireless sensor. The wireless sensor includes: a transducer for collecting data; a wireless transmitter for transmitting the data to a receiver spaced from the wireless sensor; and a parametric mode enabled (PME) piezoelectric vibrational energy harvesting (PVEH) power supply electrically communicating with each of said transducer and said wireless sensor, said PME PVEH power supply configured to scavenge vibrational energy in an environment ambient to the wireless sensor when in use so as to generate electrical power for use in powering said transducer and said wireless transmitter during use.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 2B is an enlarged partial cross-sectional exploded view of three of the PVEH modules of FIG. 1 illustrating their configurations just prior to attachment to one another.

DETAILED DESCRIPTION

Figure 1:
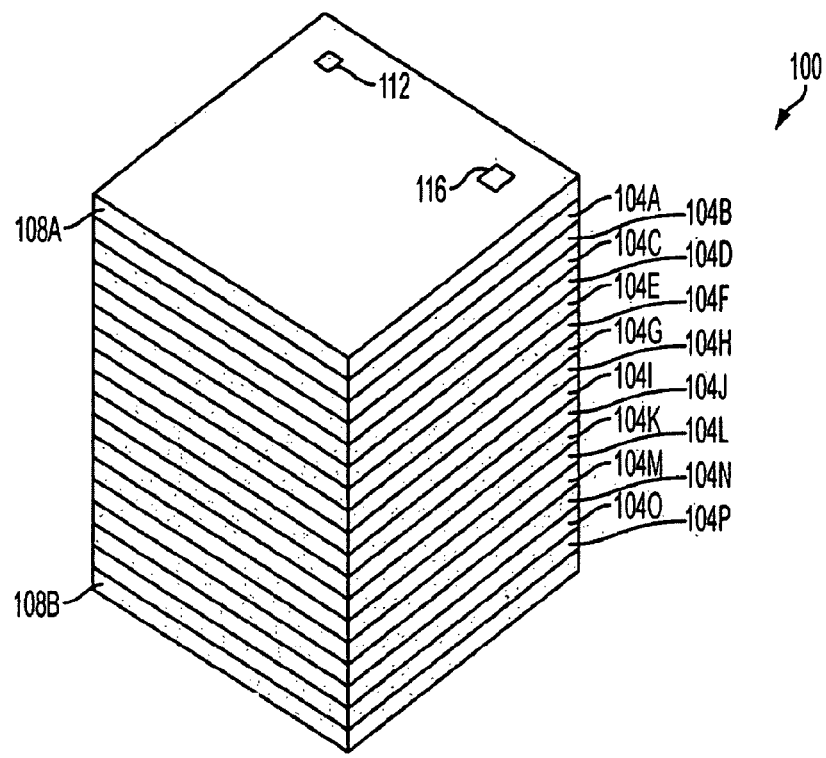
FIG. 1 is an isometric view of an example of a piezoelectric vibrational energy harvesting (PVEH) unit made in accordance with concepts of the present disclosure.

Referring now to the drawings, FIG. 1 illustrates an example of a piezoelectric vibrational energy harvester (PVEH) unit 100 made in accordance with concepts of the present disclosure. As those skilled in the art will appreciate, such a PVEH unit may be used to generate electrical power from scavenged vibrational energy in the ambient environment in which the PVEH unit is mounted or otherwise placed. Although the illustrated PVEH unit 100 of FIG. 1 is in the microscale size regime—this particular example is roughly a rectangular parallelepiped of about 7.5 mm along each base edge and 13.5 mm along the height—other PVEH units made in accordance with concepts of the present disclosure can be alternatively constructed in another size regime, such as a mesoscale-size regime, using fabrication techniques that will be readily understood by those skilled in the art. Because of the size of exemplary PVEH unit 100, those skilled in the art will recognize that it can be made using MEMS (microelectromechanical systems) fabrication techniques. Examples of MEMS fabrication techniques are described below in connection with FIGS. 9A-P and 10A-B.

PVEH units made in accordance with concepts of the present disclosure, such as PVEH unit 100, are particularly, though not exclusively, suited to applications wherein the devices they are used to power are either required or desired to be self-contained for any one or more of a variety of reasons, such as physical inaccessibility, impracticability of providing power wires or changing batteries, unavailability of alternative power sources and cost, among others. It is impractical to list all of the applications that can benefit from implementing broad concepts of the present disclosure. However, since wireless sensor networks are presently an important target application for this technology, the present disclosure contains examples of implementing these concepts in a wireless sensor and in a sensor network containing such a wireless sensor. That said, those skilled in the art will readily appreciate that wireless sensor networks are by no means the only possible application for the broad concepts disclosed herein.

Figure 2A:
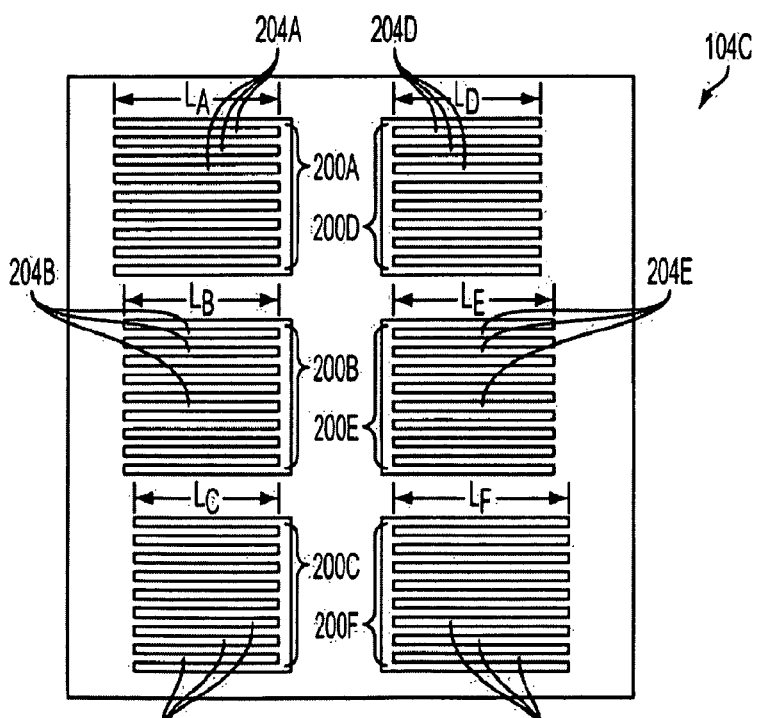
FIG. 2A is an enlarged plan view of one of the PVEH modules of the system of FIG. 1 showing multiple groups of parametric-mode-enabled (PME) PVEH beams.

With continuing reference to FIG. 1, and also to FIG. 2A, at a high level, PVEH unit 100 of this example includes sixteen PVEH modules 104A-P (one of which, module 104C, is shown in detail in FIG. 2A). Modules 104A-P share the same general construction, which includes a plurality of groups of like PVEH beams, wherein all of the beams with a group are tuned the same and the tuning of the beams differs among the groups. This is illustrated in FIG. 2A by module 104C having six groups 200A-F each containing eight identically tuned PVEH beams 204A-F (in this example cantilever-type beams) and in which the beam tunings differ among the six groups. In this example, the differing tunings are provided by changing the active lengths $L_A$ through $L_F$ of PVEH beams 204A-F, respectively, as seen in FIG. 2A. Examples of additional/alternative ways to vary the tunings of PVEH beams 204A-F are mentioned below. It is also noted that in this example each PME PVEH beam 204A-F is a "bimorph" beam in terms of the layering of a piezoelectric material used to fabricate the beams and is also a "split-electrode" beam in terms of the way the electrodes for harvesting electrical energy from the piezoelectric material are specially configured for harvesting energy from the parametric mode excitation of the beam. Each of the bimorph and split-electrode concepts is described below in detail.

As will be appreciated by those skilled in the art, PVEH module 104C shown in FIG. 2A is merely one example of a virtually infinite number of configurations of a PVEH module that can be constructed using the broad concepts disclosed herein. Following are a few of the items that can be changed, alone and in various combinations with each other, to provide different designs: 1) the number of PVEH beams in each group may differ from the eight shown in different designs; 2) the number of PVEH beams can be varied among the groups; 3) the number of groups may differ from the six shown; 4) the number of non-identical groups may be different from the six shown; 5) each module may have two or more groups that are identical to one another; and 6) the PVEH beams may be other than of the cantilever type, such as the dual fixed-end type, the dual clamped-end type, simply supported type and mixed type that are combinations of other types, among others. The support conditions do not limit that application of the broad concepts of the present disclosure.

Furthermore, all of PVEH modules 104A-P need not be the same as module 104C shown in FIG. 2. For example, if six differing beam tunings are desired, all sixteen PVEH modules 104A-P of FIG. 1 may be identical. However, six differing beam tunings can be provided in other ways. For example, each PVEH module may provide two differing tunings, such that at least two others of the modules each provide yet two different tunings. As another example, entire PVEH modules may have only one beam tuning, so that the six different tunings are provided by at least six modules all having tunings differing from one another. The foregoing is just a sample of many variations that can be made to achieve a desired goal.

It is also noted that a PVEH unit made using broad concepts disclosed herein can vary in the number of differing beam tunings according to the particular design parameters at issue. For example, in some applications, only a single beam tuning will be needed for an entire PVEH unit, whereas for other applications, three, six, ten or more differing tunings may be beneficial. Some factors involved with determining how many beam tunings should be provided are discussed below.

A PVEH unit made in accordance with concepts of the present disclosure, such as PVEH unit 100 of FIG. 1, will include any one or more of a number of features that can give it a relatively high power density (power generated per unit volume) and can provide it with a relatively wide frequency response. These features include specially designed PVEH beams that not only harvest vibrational energy from fundamental-mode excitation of the beams in the direction of the driving vibration, but also harvest energy from parametric-mode excitation of the beams. Parametric-mode excitation is a non-linear resonance mode perpendicular to the driving force (vibration). The PVEH beams of the present disclosure that are specially designed to harvest energy from parametric-mode excitation are conveniently referred to herein and in the appended claims as "parametric mode enabled," or "PME." By varying the cross-sectional properties of each PME beam, the frequency of parametric-mode excitation of that beam is tunable to create the desired effect of either increasing the power density of a PVEH unit or increasing the effective excitation bandwidth of the unit, or both. In addition to increasing the effective excitation bandwidth of each beam by tuning the parametric-mode excitation frequency, the overall excitation bandwidth of a PVEH unit of the present disclosure can be increased by providing multiple groups of PVEH beams wherein the groups are tuned to slightly different frequencies. This is illustrated in the context of module 104C of FIG. 2A by the presence of the six groups 200A-F having six different tunings, as illustrated visually by the six different lengths $L_A$ through $L_F$ of beams 204A-F, respectively. As described below, the differing tunings can be provided in other ways, such as providing beams 204A-F in differing groups with differing proof masses (228 in FIGS. 2B and 2C) and a combination of varying the lengths $L_A$ through $L_F$ and providing differing proof masses, among others.

Before describing several examples of PME PVEH beams, it is seen in FIG. 1 that PVEH modules 104A-P are configured stacked and secured with one another and with end modules 108A-B so as to form an integrated, self-packaged unit. Although not illustrated in detail in FIG. 1, PVEH modules 104A-P are electrically connected with one another and with end modules 108A-B so that the electrical power available from outputs 112, 116 is the sum of power generated by all of the PME PVEH beams, such as beams 204A-F (FIG. 2A), of all of the PVEH modules. As those skilled in the art will understand, PME modules can be electrically connected to one another in either series or parallel, depending on the particular deployment of PVEH unit 100. In this example, which again is in the microscale regime, each PVEH module 104A-P is a silicon-based die made using various layer deposition, removal and etching techniques. Several processing techniques suitable for use in making such modules are described below in connection with FIGS. 9A-P and FIGS. 10A-B. End modules 108A-B of this example are also made using similar techniques, and the various PVEH modules 104A-P and end modules are bonded to one another using suitable bonding techniques. An example of a suitable bonding technique is described below in connection with FIGS. 2B-C. It is noted that one or both end modules 108A-B may include rectifying and regulating circuitry (not shown) as appropriate for a particular design.

Figure 2C:
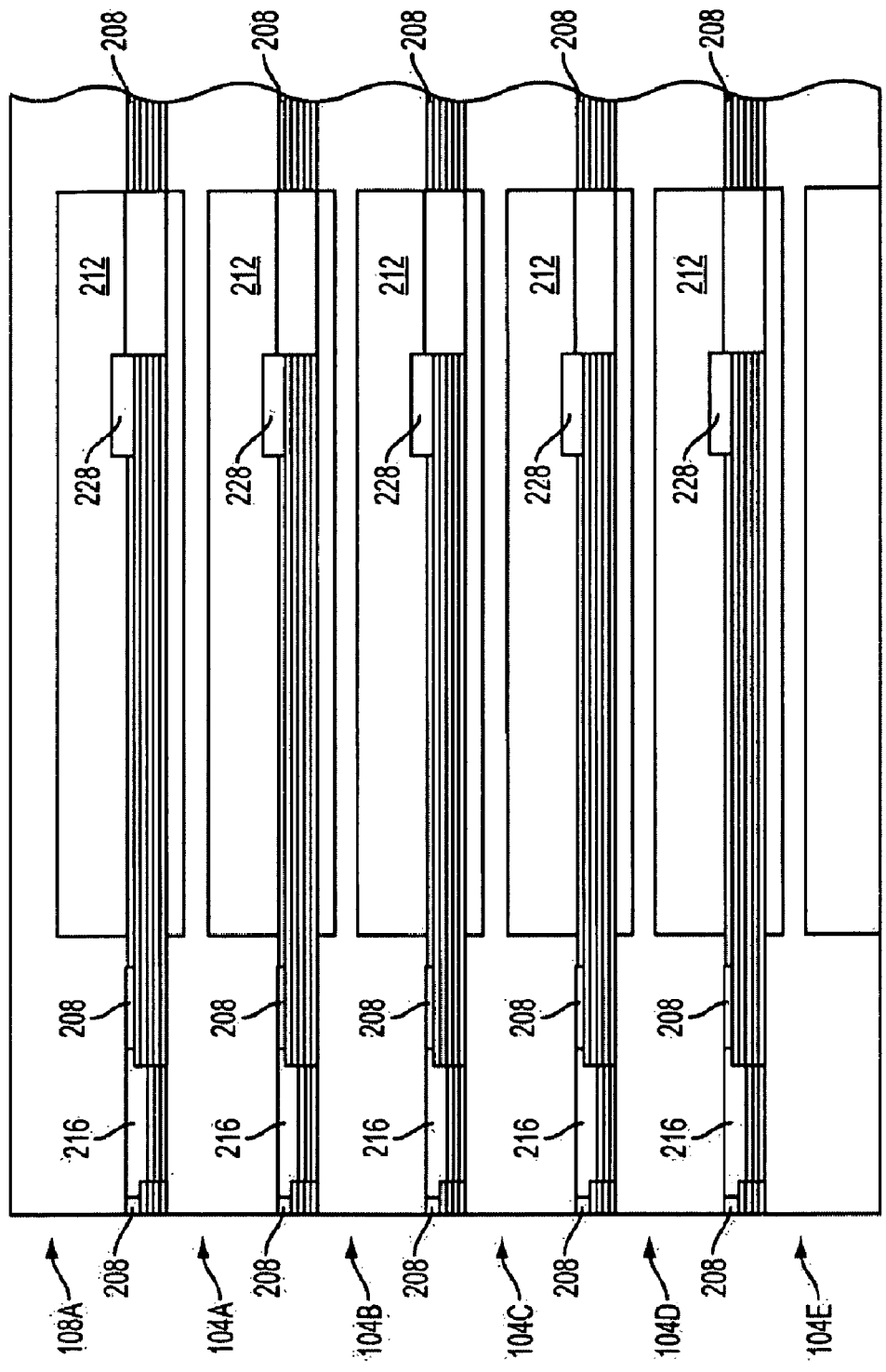
FIG. 2C is an enlarged partial cross-sectional view of the upper six PVEH modules of FIG. 1 affixed to one another in the finished stack.

FIGS. 2B-C illustrate an example of how the PVEH modules 104A-B and end modules 108A-B of FIG. 1 may be secured and electrically connected to one another. FIG. 2B illustrates three of PVEH modules 104A-P of FIG. 1, specifically PVEH modules 104E-G, in proper relation to one another as they would be during formation of the stack of PVEH unit 100 (FIG. 1). As seen in FIG. 2B, in this example, each module 104E-G is provided with glass frit 208 that will be used to bond the modules to each other in a vacuum assembly process. Glass frit 208 is placed in a manner that will hermetically seal the cavities 212 that will contain the beams (here, beams 204A) after PVEH modules 104E-G are secured to one another. A ball of solder 216 is placed on each PVEH module 104E-G at each location where electrical connection must be made between the modules. In this design, the bottom electrode 220 is electrically connected to the silicon substrate 224. FIG. 2C shows the upper six modules, i.e., end module 108A and PVEH modules 104A-E, bonded to one another after the vacuum assembly process. As can be seen in FIG. 2C, during the vacuum assembly process that includes heating modules 104A-E, 108A to a sufficient temperature that melts glass frit 208 and solder balls 216, the solder balls flow and solidify to form fill a space between adjacent modules, thereby providing electrical continuity between the adjacent modules. During the vacuum assembly process, a vacuum is formed in each of cavities 212, and that vacuum is held by the hermetic seal provided by the melted and solidified glass frit 208.

For the sake of illustration, the following Table provides approximate minimum and maximum values of a number of relevant parameters for a set of exemplary microscale PVEH units (not shown) generally similar to PVEH unit 100 of FIG.

1. Like PVEH unit 100, each of the individual PVEH modules in the exemplary set (corresponding to ones of PVEH modules 104A-P) is a 7.5 mm×7.5 mm square die having a thickness of 675 µm, which is a typical thickness of a 150 mm diameter silicon wafer. Of course, other wafer thicknesses can be used, but a 675 µm thick wafer provides ample thickness for creating the two-sided cavities 212 illustrated in FIGS. 2B-C. The end modules (corresponding to end modules 108A-B of FIG. 1) in this example are made from the same wafer(s) as used to make the PVEH modules and, therefore, have the same thickness. Each of the dies corresponding to the PVEH modules includes bimorph, split-electrode PME PVEH beams made using the processing techniques described below in connection with FIGS. 9A-P and 10A-B. In this example, each PVEH module (chip) contained eight like-tuned groups each having twelve PME PVEH beams electrically connected together in series and produces 0.2 V and 100 µW of power. In this example, all of the PVEH modules in each PVEH module are electrically connected in series so as to maximize the voltage across the respective output nodes. Consequently, 10 dice stacked electrically in series, after rectification (assume a 0.5 V loss), will achieve 1.5 V and 1 mW of power. This will be a 7.425 mm tall stack, including a cap chip. Similarly, a 4.05 mm tall stack will produce 0.5 V and 0.5 mW of power, a 10.8 mm stack will produce 2.5 V and 1.5 mW of power, a 20.925 mm high stack will produce 5.5 V and 3 mW of power, etc.

Of course, the values in the following table are specific to this example and similar values for other PVEH units made in accordance with the broad concepts disclosed herein will have other values depending on their scale and construction. For example, while minimum and maximum operating frequencies in the Table are indicated as 50 Hz and 1500 Hz, respectively, PVEH units and modules made in accordance with the broad principles disclosed herein can be made to have other operating frequencies. That said and generally speaking, many applications for PVEH units and modules made in accordance with the present disclosure will likely requires operating frequencies (bands) in a range of 50 Hz to 250 Hz.

TABLE

| Parameter | Min. | Max. | units |
|---|---|---|---|
| Volume | 0.22 | 1.17 | cm$^3$ |
| Voltage | 0.5 | 5.5 | Volts |
| Power | 0.5 | 3.0 | mWatts |
| Power Density | 2.27 | 2.72 | mW/cm$^3$ |
| Acceleration | 1 g | 1 g | — |
| Frequency | 50 | 1500 | Hertz |
| Bandwidth | 2 | 10 | Hertz |

Note:
All values estimated

Figure 3:
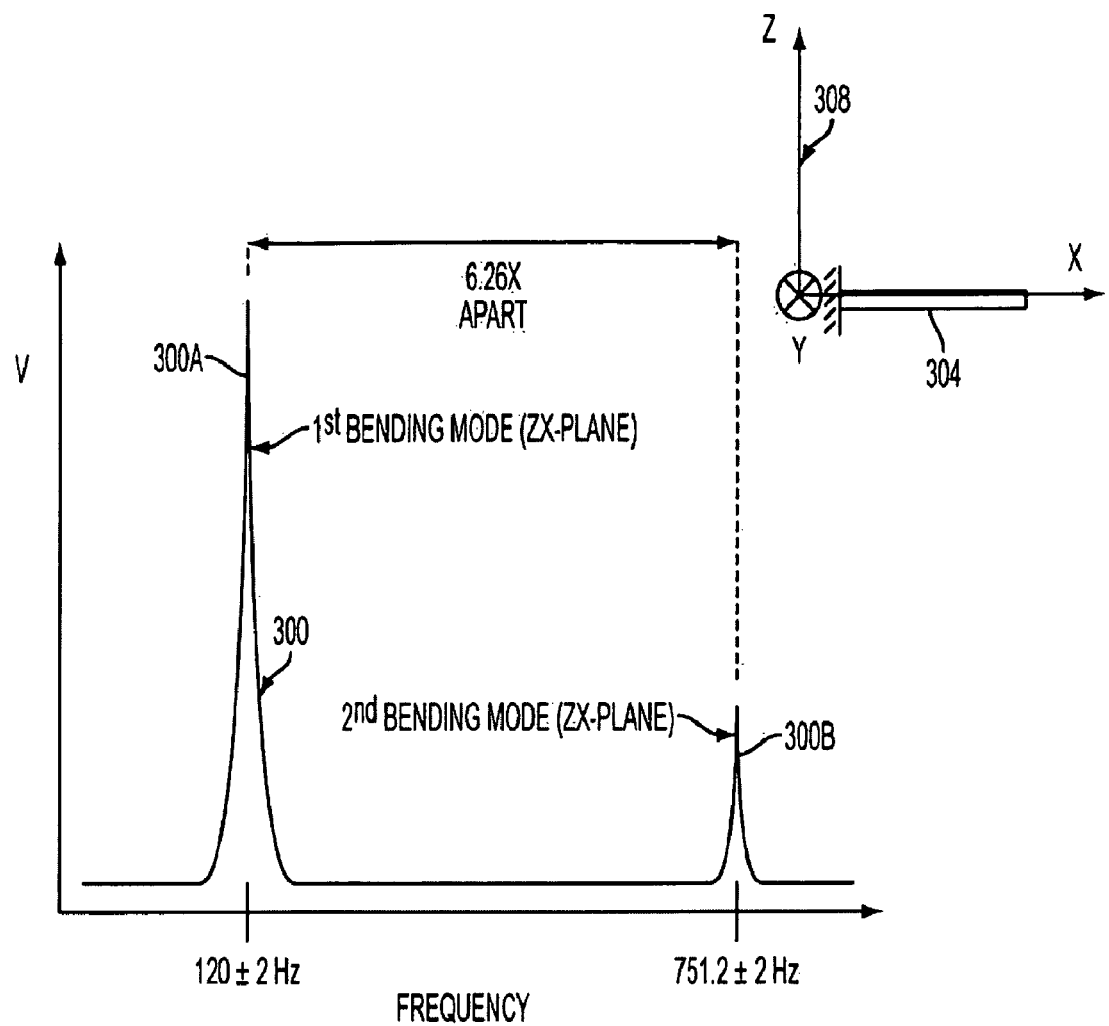
FIG. 3 is a graph of a typical frequency spectrum (voltage versus frequency) for a cantilever-type PVEH beam made using conventional practices.
Figure 4:
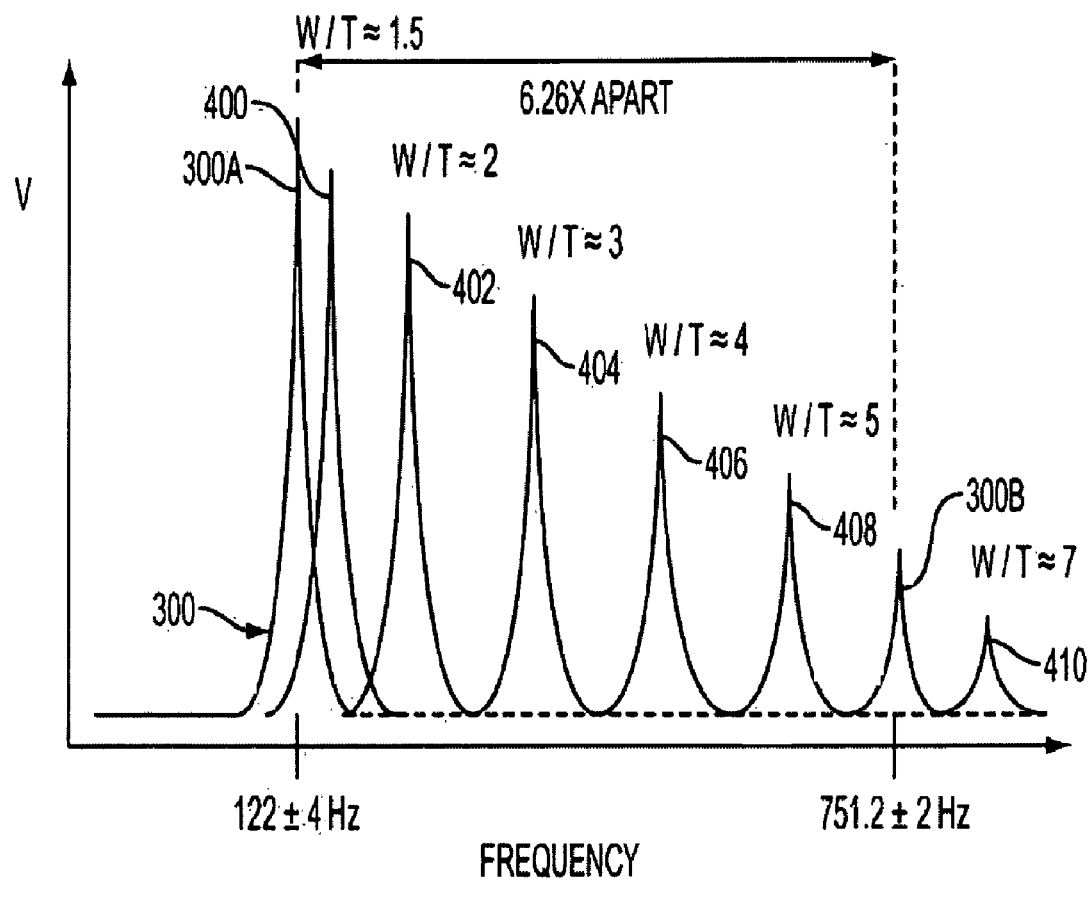
FIG. 4 is a graph of frequency spectra (voltage versus frequency) for a set of cantilever-type PME PVEH beams made using concepts of the present disclosure, the graph showing the effects of differing width:thickness ratios on the frequency spectra of the differing beams.
Figure 5:
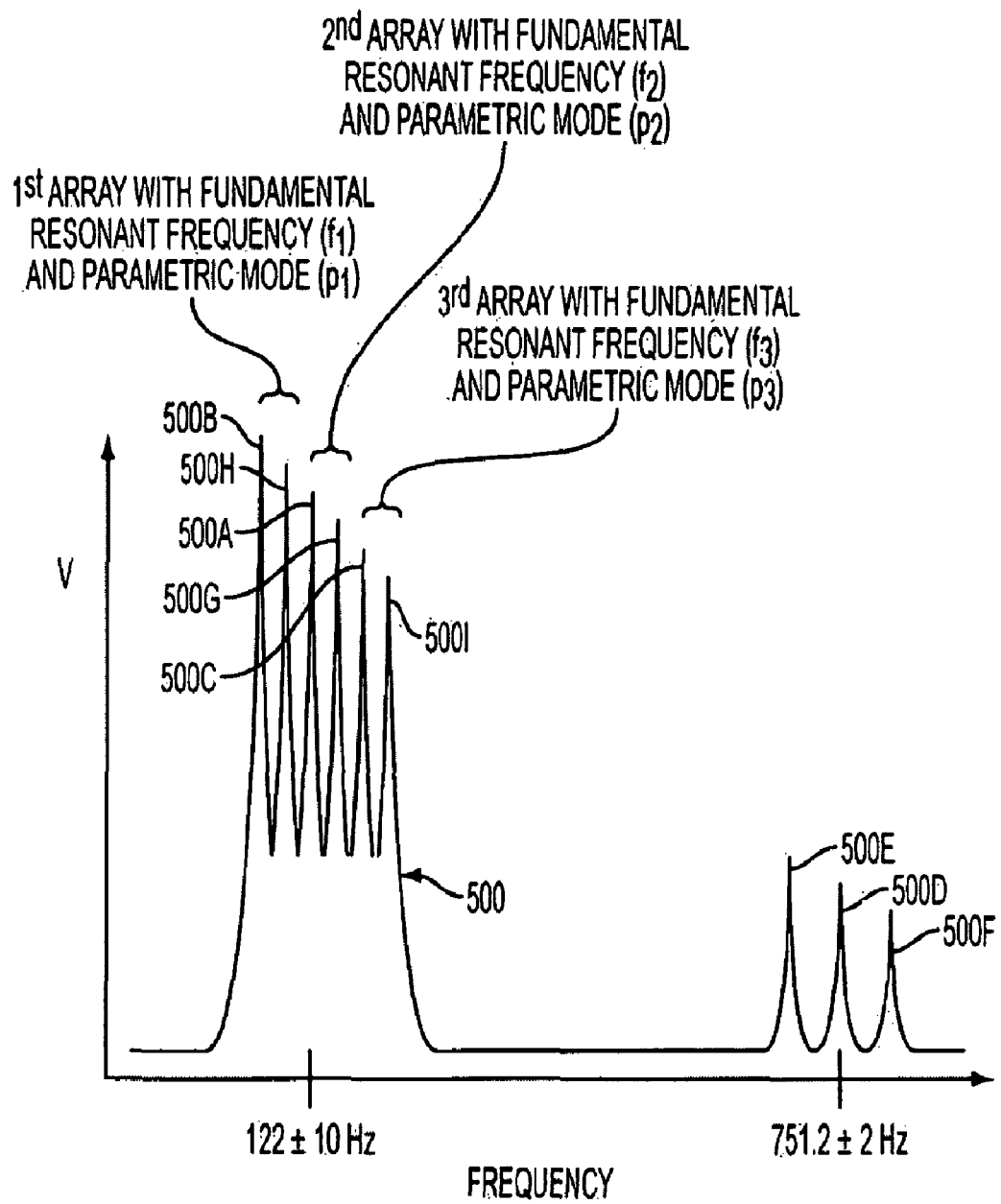
FIG. 5 is a graph of a frequency spectrum (voltage versus frequency) for a PVEH module containing three groups of PME beams in which the groups are tuned to slightly different frequencies.

FIGS. 3-5 are presented to highlight differences between PME PVEH technology of the present disclosure and conventional PVEH technology, as well as to explain concepts attendant the exploitation of parametric mode excitation. FIG. 3 is a frequency spectrum 300 for a conventional rectangular-cross-sectioned cantilever PVEH beam having a width that is much greater than its thickness. For example, the width of such a conventional PVEH beam would be on the order of 50 times the thickness of the beam. FIG. 3 also shows schematically a cantilever beam 304 and the coordinate system 308 used in connection with FIGS. 3-5 (and also FIGS. 6-8). In a conventional PVEH beam having a width much greater than its thickness, parametric mode excitation is essentially nonexistent. Consequently, and considering only the first harmonic, frequency spectrum 300 has only a fundamental resonance frequency peak 300A, here at 120 Hz±2 Hz, due to first bending mode excitation in the ZX-plane and a first harmonic frequency peak 300B, here at 751.2 Hz±2 Hz, due to second mode excitation also in the ZX plane, each due to a driving vibration in the ZX-plane.

FIG. 4 reproduces frequency spectrum 300 of FIG. 3, and its fundamental and first harmonic peaks 300A-B, respectively and also contains six additional peaks 400, 402, 404, 406, 408, 410 resulting from beam bending in the YZ plane due to parametric mode excitation at differing width:thickness ratios much smaller than the ratio (>50) of FIG. 3. Again, the parametric mode excitation causes bending in a plane, here the YX-plane) perpendicular to the plane of driving vibration, here the ZX-plane. It is noted that frequency spectrum 300 is equally applicable to the much narrower beams that provide parametric-mode peaks 400, 402, 404, 406, 408, 410 because, generally, for a beam of a particular Z-direction thickness the frequency response spectrum does not change with changing Y-direction widths.

As seen from FIG. 4, parametric-mode peaks 400, 402, 404, 406, 408, 410 correspond, respectively, to width:thickness ratios of 1.5, 2, 3, 4, 5 and 7, with the heights of these peaks decreasing as the ratio increases. While any of these, or other similarly valued width:thickness ratios, can be exploited for parametric mode vibrational energy harvesting, ratios of 1 to around 1.5 are of particular note since the corresponding response peaks (illustrated by peak 400) in this range overlap with fundamental resonance peak 300A. Generally, a width:thickness ratio puts the frequency of the parametric mode excitation within about 5 Hz of the fundamental resonance frequency. Consequently, implementing width:thickness ratios in this regime in conjunction with circuitry that exploits the attendant parametric mode excitation can be used to broaden the useful bandwidth of a PVEH device, such as PVEH unit 100 of FIG. 1. It is noted that at a width:thickness ratio of 1, the parametric mode peak (not shown) would coincide with fundamental resonance peak 300A. Consequently, use of appropriate circuitry that fully exploits both fundamental resonance excitation and parametric mode excitation could essentially double the output of a PME PVEH device relative to the same device that exploits only the fundamental resonance excitation.

While tuning a PME PVEH beam so that the parametric mode excitation frequency is close to the fundamental resonance frequency of the beam is very useful in broadening the bandwidth of the frequency response of that beam, those skilled in the art will readily appreciates that other parametric mode tunings may also be useful. Generally, but without necessarily being limiting, it is presently envisioned that tunings (for rectangular cross-sectioned beams) that may find useful application vary from a width:thickness ratio of 1:1 to 8:1. For example, there may be environments containing two specific fixed vibration frequencies that are more than 5 Hz apart (width:thickness ratio>1.5). In such a case, the fundamental resonance frequency of a PME PVEH beam could be tuned to one of the frequencies and the parametric mode frequency could be tuned to the other, say, for example, by making the width:thickness ratio of the beam somewhere from 2:1 to 8:1, as required. As another example, the width:thickness ratio could be 6.26:1. This would double the output voltage and power of the second bending resonance mode (see first harmonic peak 300A and peaks 408, 410 corresponding to width:thickness ratios 5:1 and 7:1, respectively).

With FIG. 4 illustrating the concept of bandwidth broadening by exploiting parametric mode excitation, FIG. 5 illustrates how the effective bandwidth of a PVEH device of the present disclosure, such as PVEH unit of FIG. 1, can be further broadened by providing PME beams having slightly different fundamental resonance frequency tunings. FIG. 5 shows a frequency response spectrum 500 for a system (not shown) of PME PVEH beams that includes: 1) one or more beams each tuned to the same fundamental resonance frequency in the ZX-plane (see FIG. 3) as the beam in FIG. 3, i.e., 122 Hz (peak 500A); 2) one or more beams each tuned to have a fundamental frequency in the ZX-plane of 114 Hz (peak 500B); and 3) one or more beams each tuned to have a fundamental frequency in the ZX-plane of 130 Hz (peak 500C). Second bending mode (first harmonic) peaks 500D-F corresponding respectively to fundamental mode peaks 500A-D, are shown for context but are typically negligible in designing such a system. In addition to these differing fundamental resonance tunings in the ZX-plane, each of the differently tuned beams is provided with a width:thickness ratio of about 1.5 (again, thickness is in the Z-direction and width is in the Y-direction), which produces parametric mode excitation peaks 500G-I that correspond respectively, to fundamental resonance peaks 500A-C. As can be readily seen, adding the effects of both providing multiple slightly offset fundamental resonance tunings and exploiting parametric mode excitations of the differently tunes beams provides significant bandwidth broadening. In this example, the overall broadened bandwidth centered near 122 Hz is about 20 Hz.

Bandwidth broadening in high quality factor (Q) devices such as largely undamped PVEH beams is useful for any one or more of a variety of reasons. For example, for PVEH devices that must operate over a range of temperatures, a broadened bandwidth allows the devices to operate at maximum effectiveness over the range as the beams stiffen and relax with the changing temperature. As another example, a broadened bandwidth device is more effective in environments where the ambient vibrations vary. Broadened bandwidth devices also provide greater tolerance to manufacturing variation and can also provide production economies in that a single device will be useful over a broader range of frequencies, so that a few broadened bandwidth devices can be used in place of many narrower bandwidth devices for a given large range of frequencies. These and other benefits of bandwidth broadening that can be achieved using concepts disclosed herein will be readily understood and appreciated by those skilled in the art.

Figure 6:
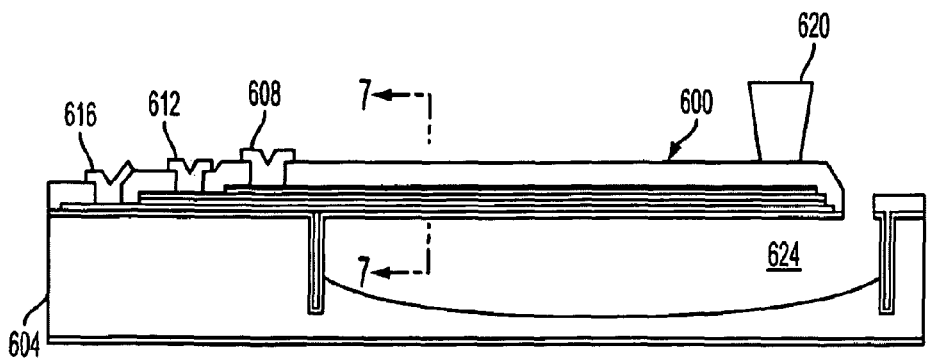
FIG. 6 is an enlarged longitudinal cross-sectional view of a bimorph PME PVEH beam made in accordance with concepts of the present disclosure.
Figure 7:
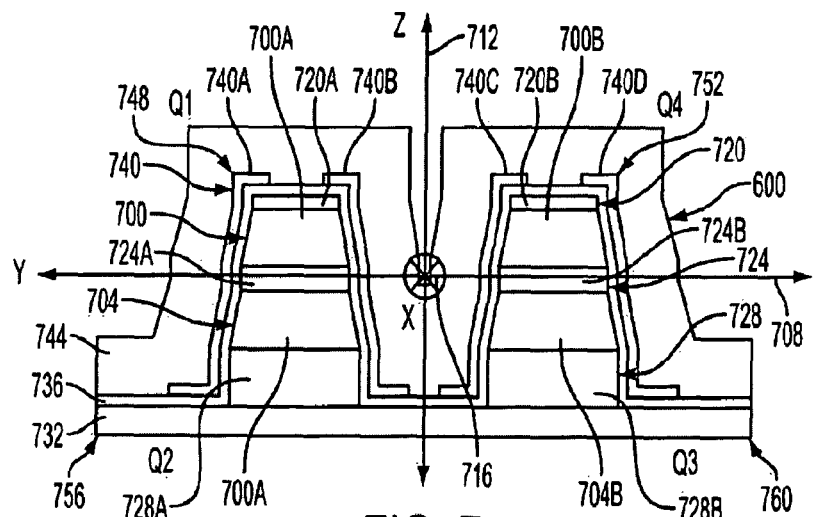
FIG. 7 is a cross-sectional view as taken along line 7-7 of FIG. 6.

FIGS. 6 and 7 illustrate a bimorph PME PVEH beam 600 that can be used for each of beams 204A-F of PVEH module 104C of FIG. 2. As readily seen in FIG. 6, bimorph beam 600 is a cantilever beam fixed at one end and free at the other. In this example, bimorph beam 600 is a microscale structure formed on a silicon wafer 604 using fabrication steps similar to the steps illustrated below in connection with FIGS. 9A-P and 10A-B. While the explanation of bimorph beam 600 is to be understood in this context, those skilled in the art will readily understand that the basic structure of this bimorph beam could alternatively be executed in another size regime, such as a mesoscale regime, by changing the fabrication techniques accordingly. Since those skilled in the art will understand the alternative fabrication techniques necessary to execute the structure of bimorph beam 600 at another scale, those alternative techniques do not need to be described herein for those skilled in the art to appreciate the broad scope of the present disclosure. The reader is referred to FIGS. 9A-P and 10A-B and accompanying text for an explanation of fabrication techniques suitable for forming microscale bimorph beam 600.

As best seen in FIG. 7, beam 600 is considered to be "bimorph" because it has two distinct and separate piezoelectric layers 700, 704, which are located on opposite sides of the neutral axis for bending in the ZX-plane (here set to coincide with the Y-axis 708 of the global coordinate system). As those skilled in the art will appreciate, piezoelectric layers 700, 704 are located on opposite sides of neutral axis 708 so that during bending in the ZX-plane the entirety of each layer is either positively or negatively strained so as to avoid internal electrical charge cancellation in the piezoelectric material that would occur if a single layer straddled the neutral axis. If either of piezoelectric layers 700, 704 straddled neutral axis 708 during ZX-plane bending, a portion of that layer would have a positive strain and another portion would have a negative strain, with the resultant electrical charges canceling one another.

In this example, each of these layers is split into two portions 700A-B, 704A-B, with portions 700A, 704A falling on one side of the neutral axis of YX-plane bending (here, for convenience set to coincide with the Z-axis 712) and portions 700B, 704B falling on the other side of neutral axis 712. The reason for splitting piezoelectric layers 700, 704 in this manner is to prevent the charge cancellation in parametric mode bending that would occur if these layers were continuous across neutral axis 712. As is readily seen in FIG. 7, piezoelectric portions 700A, 704B, 704B, 700A can be considered to fall, respectively, in quadrants Q1 through Q4 defined by neutral axes 708, 712. In this connection, it is noted that while the parametric mode bending occurs in the YZ-plane perpendicular to the fundamental mode bending plane (ZX-plane), the actual motion of the free end of bimorph beam 600 under the influence of a sufficient driving vibration is circular in nature. Consequently, the quadrantization of piezoelectric portions 700A-B, 704A-B provides an effective way to harvest the charges from these portions quadrant by quadrant. For example, when the bending of bimorph beam 600 is purely in the ZX-plane (i.e., about Y-axis 708), piezoelectric portions 700A-B will be equally strained with one another at one polarity and piezoelectric portions 704A-B will be equally strained with one another at the opposite polarity. When the bending of bimorph beam 600 is purely in the YX-plane (i.e., about Z-axis 712), piezoelectric portions 700A, 704A will be equally strained with one another at one polarity and piezoelectric portions 700B, 704B will be equally strained with one another at the opposite polarity. When the bending of bimorph beam 600 is in a plane rotated about the X-axis 716 to an angle between the YX- and ZX planes, either piezoelectric portions 700A, 704B or piezoelectric portions 700B, 704A will have the maximum and minimum opposite polarity strains or piezoelectric portions 700B, 704A, depending on the location of that plane.

Still referring to FIG. 7, bimorph beam 600 includes three electrode layers 720, 724, 728 split into individual electrodes 720A-B, 724A-B, 728A-B to facilitate the quadrant-by-quadrant harvesting of electrical charge from corresponding respective ones of piezoelectric portions 700A-B, 700A-B. The fact that electrode layers 720, 724, 728 are split into individual electrodes 720A-B, 724A-B, 728A-B gives rise to the term "split-electrode" used to describe the PME PVEH beams of the present disclosure having this type of structure. It is noted that the term "split-electrode" is not, however, limited to a situation wherein a single layer or large electrode is split during subsequent fabrication steps. Rather, the term "split-electrode" also applies to situations in which separately formed electrodes are provided on opposite sides of neutral axis 712. In other words, the "split electrode" concept applies to the fact that parametric mode charge harvesting electrodes are spaced from one another, rather than to how they are formed.

More particularly relative to the functioning of electrodes 720A-B, 724A-B, 728A-B, electrodes 720A, 724A are active in harvesting charge from piezoelectric portion 700A in quadrant Q1, electrodes 724A, 728A are active in harvesting charge from piezoelectric portion 704A in quadrant Q2, electrodes 724B, 728B are active in harvesting charge from piezoelectric portion 704B in quadrant Q3 and electrodes 720B, 724B are active in harvesting charge from piezoelectric portion 704A in quadrant Q4. As is readily seen, electrodes 724A-B each straddle neutral axis 712, thereby providing the separation of corresponding respective piezoelectric portions 700A-B, 704A-B from neutral axis 712 that results in the avoidance of charge separation as described above. Referring to FIG. 6, bimorph beam 600 may be provided with contacts 608, 612, 616 corresponding respectively to electrode layers 720, 724, 728 for communicating the charges collected from piezoelectric portions 700A-B, 704A-B (FIG. 7) to appropriate charge collection circuitry (not shown).

Still referring to FIG. 6, in this embodiment, bimorph beam 600 has a proof mass 620 located adjacent the free end of the beam. Proof mass 620 is provided to lower the tuning of bimorph beam 600 and also to increase the power output of the beam. In other embodiments, a proof mass need not be provided at all, while in yet other embodiments, more than one proof mass may be provided, for example, at differing locations along the bimorph beam. As those skilled in the art will readily appreciate, bimorph beam 600 can be tuned by varying any one or more of a number of parameters, such as the cross-sectional shape of the beam, cross-sectional dimensions of the beam, the length of the beam (exemplary thicknesses), the mass of the proof mass(es), if any, the location(s) of the proof mass(es) on the beam, and the materials used to make the beam.

As mentioned above, bimorph beam 600 is made using silicon wafer 604 as a substrate. During the fabrication of bimorph beam 600 various layers, such as electrode layers 720, 724, 728 and piezoelectric layers 700, 704 are deposited and etched according to known techniques. To create free-ended cantilevered bimorph beam 600, one of the fabrication steps involves etching away a portion of silicon wafer 604 to create a cavity 624 beneath the beam and to create the separation between any adjacent bimorph beam(s) or other laterally adjacent portion of the wafer. Again, examples of fabrication steps that can be used to make bimorph beam 600 are described below in connection with FIGS. 9A-P and 10A-B.

Referring to FIG. 7, and also to FIG. 6, other layers included in bimorph beam 600 of this example include a base layer 732, an optional first insulating layer 736, an optional side-electrode layer 740 and a second insulating layer 744. Base layer 732 is provided for use in forming cavity 634 and is an artifact of that process. First insulating layer 736 is provided if optional side-electrode layer 740 is provided. Side-electrode layer 740, if provided, is patterned and etched to provide optional side electrodes 740A-D that may be used in parametric mode charge harvesting. If provided, each side electrode 740A-D acts like a charge plate of a capacitor, wherein first insulating layer 736 acts as the dielectric of the capacitor and ones of piezoelectric portions 700A-B, 704A-B act as the other charge plate. Optional side electrodes 740A-D may be made of any suitable conductive material, such as any one of the materials mentioned above relative to electrode layers 720, 724, 728. Second insulating layer 744 is provided as a protective layer and as a stress compensation layer to compensate for stresses induces in bimorph beam 600 by other layers during fabrication.

In a specific illustrative, but by no means limiting, example, the various layers of bimorph beam 600 are made of the following materials and have the following thicknesses: base layer 732 is a thermal oxide of the silicon wafer 604 having a thickness of 0.5 µm; electrode layer 728 is a molybdenum (Mo) layer having a thickness of 1.0 µm; piezoelectric layer 704 is an aluminum nitride (AlN) layer having a thickness of 1.0 µm; electrode layer 724 is an Mo layer having a thickness of 0.5 µm; piezoelectric layer 700 is an AlN layer having a thickness of 1.0 µm; electrode layer 720 is an Mo layer having a thickness of 0.2 µm; first insulating layer 736 is a PECVD oxide layer having a thickness of 0.1 µm to 0.2 µm; side-electrode layer 740 is an Mo layer having a thickness of 0.2 µm; and second insulating layer 744 is a PECVD oxide layer having a thickness of 1.8 µm. Of course, in other embodiments, the dimension may vary. In this connection, it is noted that all thickness and dimension used herein are illustrative and can be increased or decreased. For example, increasing the volume of a PVEH unit of the present disclosure, such as PVEH unit 100 of FIG. 1, will increase the output power and voltage (although voltage depends only on thickness and length of the piezoelectric layer(s)), yet if done correctly the resonance frequency could remain unchanged or be altered if desired. A drawback to increasing the volume of a PVEH unit is that fewer modules/chips can be fabricated from a single wafer, thus increasing the cost per die.

It is also noted that the location of neutral axis 712 can be adjusted up and down (relative to FIG. 7) by changing the thicknesses of the various layers. It is also noted for clarity that the angled sidewalls of piezoelectric portions 700A-B, 704A-B and subsequently deposited layers is merely an artifact of the etching techniques used in forming the split-electrode structure. In other embodiments, these angled sidewalls can be eliminated by selection of appropriate fabrication techniques, as can the relatively wide spacing between the two stacks 748, 752 and the overhangs 756, 760 that are also artifacts of the particular fabrication process used.

Figure 8:
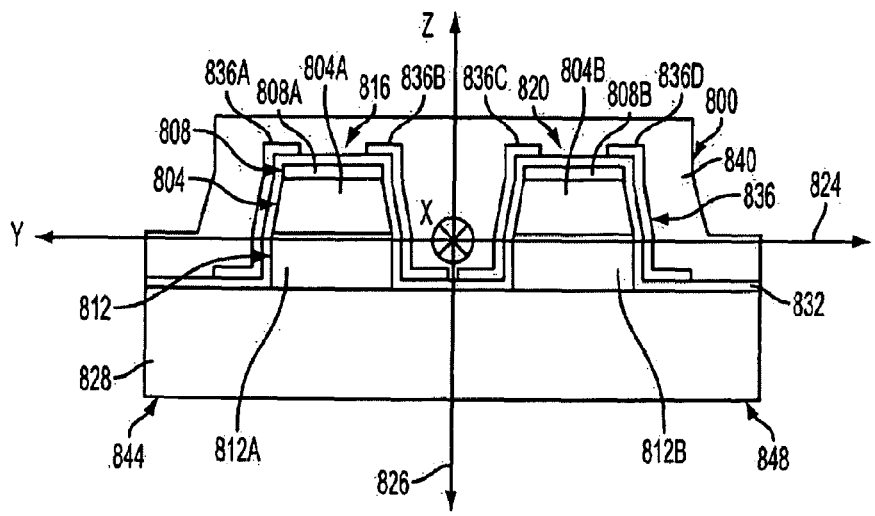
FIG. 8 is a transverse cross-sectional view of a monomorph PME PVEH beam made in accordance with concepts of the present disclosure.

Whereas FIGS. 6 and 7 illustrate an example of a bimorph split-electrode PME PVEH beam 600, FIG. 8 illustrates a monomorph version 800 of such a beam. As seen in FIG. 8, when monomorph beam 800 is made to the same microscale and is made using the same fabrication processes as bimorph beam 600 of FIGS. 6 and 7, monomorph beam 800 may be constructed very similarly to bimorph beam 600. However, instead of having two piezoelectric layers 700, 704 (FIG. 7) and three electrode layers 720, 724, 728, monomorph beam 800 of FIG. 8 has only a single piezoelectric layer 804 and a pair of electrode layers 808, 812 sandwiching the piezoelectric layer therebetween. Each of these layers 804, 808, 812 is "split" horizontally (relative to FIG. 8) so as to provide two monomorph charge generators 816, 820 electrically decoupled from one another for the reasons discussed above relating to the harvesting of charge from parametric mode excitation of beam 800. In this example, fundamental resonance excitation occurs in the ZX-plane, and parametric mode excitation occurs in the YZ-plane, as it did in bimorph beam 600 of FIGS. 6 and 7. With the splitting of layers 804, 808, 812, stack 816 contains piezoelectric portion 804A and corresponding electrodes 808A, 812A, and stack 820 contains piezoelectric portion 804B and corresponding electrodes 808B, 812B.

To avoid charge cancellation within piezoelectric layer 804 during bending in the ZX-plane, the thicknesses of the various layers of monomorph beam 800 are chosen so that the entirety of the piezoelectric layer lies on one side or the other of the neutral bending axis, here to which the global Y-axis 824 is set for convenience. In this manner, during ZX-plane bending, the entirety of piezoelectric layer 804 is strained either positively or negatively. Similar to bimorph beam 600 of FIGS. 6 and 7, charge cancellation within piezoelectric layer 804 is avoided by splitting layers 804, 808, 812 so that stacks 816, 820 lie on opposite sides of the neutral axis, here global Z-axis 826.

Electrodes 808A-B may be electrically tied to one another beyond the fixed end of monomorph beam 800 (see FIG. 6, which can be used to envision a cantilever configuration of monomorph beam 800), as may electrodes 812A-B. Then, monomorph beam 800 may be provided with electrical contacts (not shown) in a manner similar to electrical contacts 608, 612, 616 (FIG. 6) of bimorph beam 600.

As with bimorph beam 600, monomorph beam 800 may have various layers in addition to piezoelectric and electrode layers 804, 808, 812. In this example, such additional layers include a base layer 828, an optional first insulating layer 832, an optional side-electrode layer 836 and a second insulating layer 840. Base layer 828 is an artifact of the process used to form monomorph beam 800 and provides a unitary base for stacks 816, 820. First insulating layer 832 is provided if optional side-electrode layer 836 is provided. Side-electrode layer 836, if provided, is patterned and etched to provide optional side electrodes 836A-D that may be used in parametric mode charge harvesting. If provided, each side electrode 836A-D acts like a charge plate of a capacitor, wherein first insulating layer 832 acts as the dielectric of the capacitor and ones of piezoelectric portions 804A-B act as the other charge plate. Optional side electrodes 836A-D may be made of any suitable conductive material, such as any one of the materials mentioned above relative to electrode layers 720, 724, 728 of bimorph beam 600 of FIGS. 6 and 7. Second insulating layer 840 is provided as a protective layer and as a stress compensation layer to compensate for stresses induced in bimorph beam 600 by other layers during fabrication. In this example, first and second insulating layers 832, 840 are oxides formed by plasma-enhanced chemical vapor deposition (PECVD).

In a specific illustrative, but by no means limiting, example, the various layers of monomorph beam 800 are made of the following materials and have the following thicknesses: base layer 828 is a thermal oxide of the original silicon wafer (see FIGS. 6 and 7 and accompanying text) having a thickness of 2.0 μm; electrode layer 812 is an Mo layer having a thickness of 1.0 μm; piezoelectric layer 804 is an AlN layer having a thickness of 1.0 μm; electrode layer 808 is an Mo layer having a thickness of 0.2 μm; first insulating layer 832 is a PECVD oxide layer having a thickness of 0.2 μm; side-electrode layer 836 is an Mo layer having a thickness of 0.1 μm; and second insulating layer 840 is a PECVD oxide layer having a thickness of 1.3 μm. Of course, in other embodiments, the dimension may vary. It is noted for clarity that the angled sidewalls of piezoelectric portions 804A-B and subsequently deposited layers is merely an artifact of the etching techniques used in forming the split-electrode structure. In other embodiments, these angled sidewalls can be eliminated by selection of appropriate fabrication techniques, as can the relatively wide spacing between the two stacks 816, 820 and the overhangs 844, 848 that are also artifacts of the particular fabrication process used.

Though not shown, monomorph beam 800 may include one or more proof masses in a manner similar to bimorph beam 600 of FIGS. 6 and 7, if desired or needed. In addition, monomorph beam 800 may be tuned for fundamental resonance response using any one or more of the techniques mentioned above relative to bimorph beam 600. Further, the parametric mode response of monomorph beam 800 can be tuned by varying the ratio of the width W' of the beam to the thickness T' of the beam (assuming a substantially rectangular cross-sectional shape) as described above in connection with FIG. 4. In the exemplary microscale construction of monomorph cantilever beam 800 described above, upward curling of the beam occurs as a result of strain induced in the upper portion of the beam by piezoelectric layer 804. This curling can be controlled to be within tolerable limits using appropriate techniques. It is noted that bimorph beam 600 of FIGS. 6 and 7 has less tendency to curl due to the presence of piezoelectric layers 700, 704 on opposite sides of ZX-bending neutral axis 708.

Figure 9A:
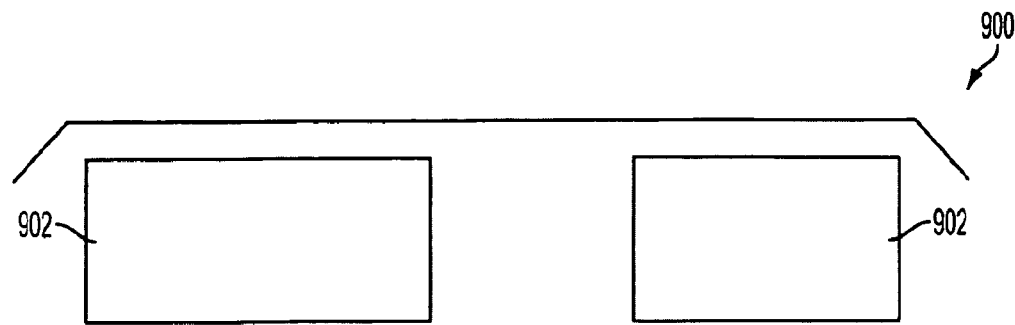
FIGS. 9A-P are a series of diagrams illustrating steps of a fabrication process that can be used to make a monomorph PME PVEH beam, wherein each of FIGS. 9A-P contains a longitudinal cross-sectional view and a transverse cross-sectional view relative to the finished beam.
Figure 9B:
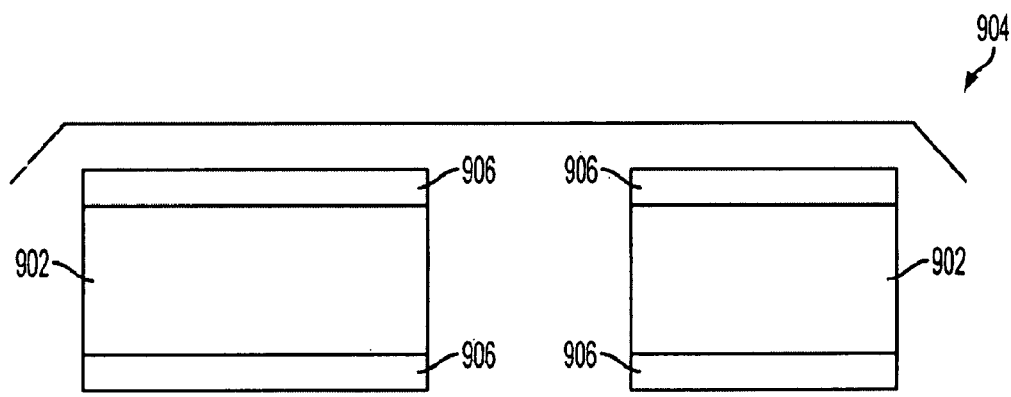
Figure 9C:
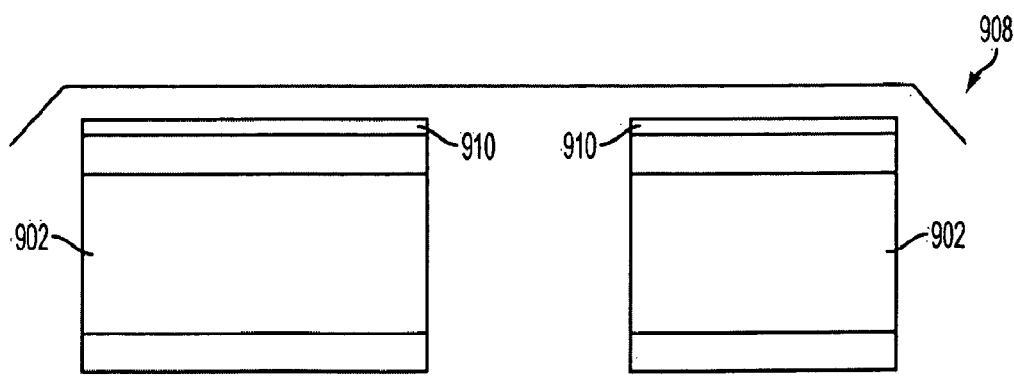
Figure 9D:
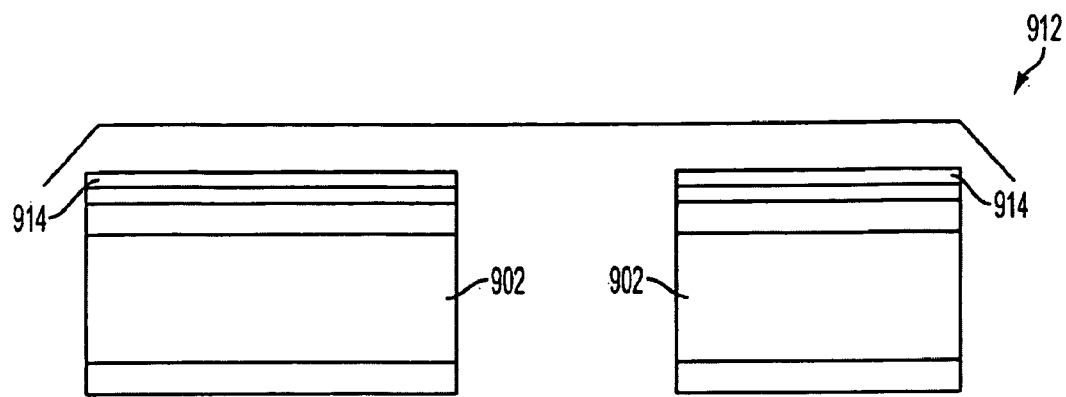
Figure 9E:
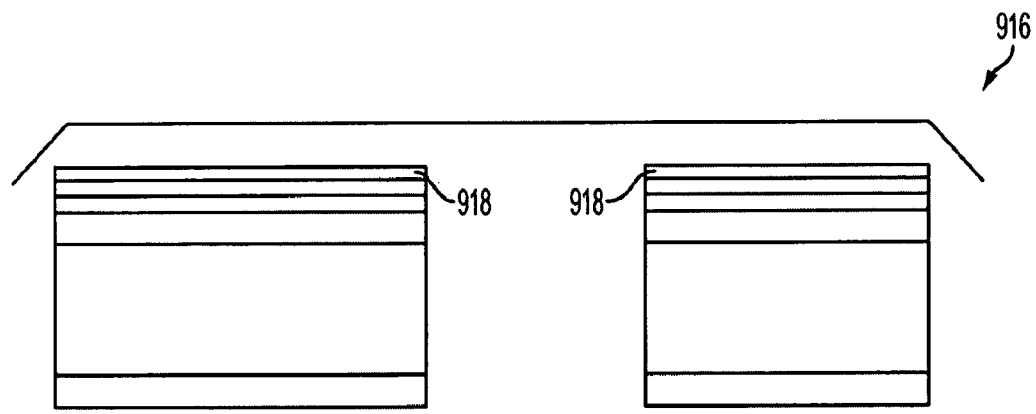
Figure 9F:
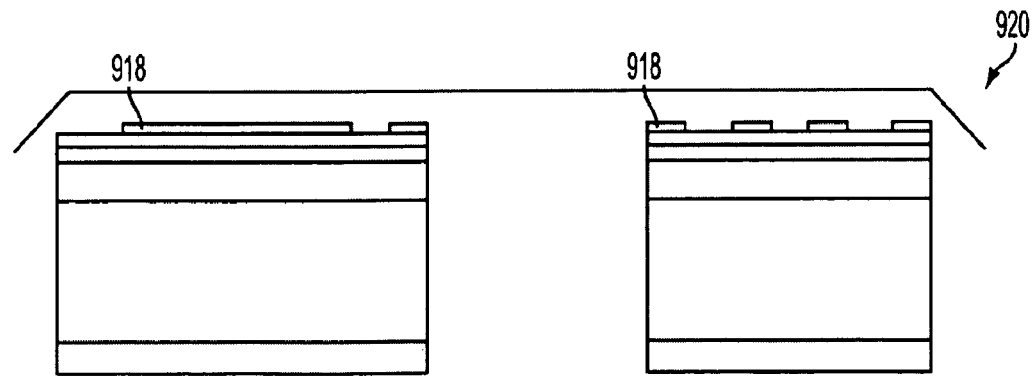
Figure 9G:
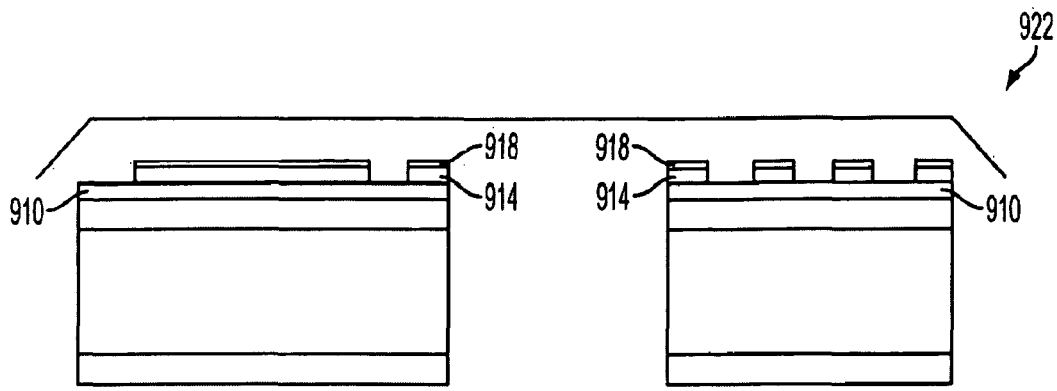
Figure 9H:
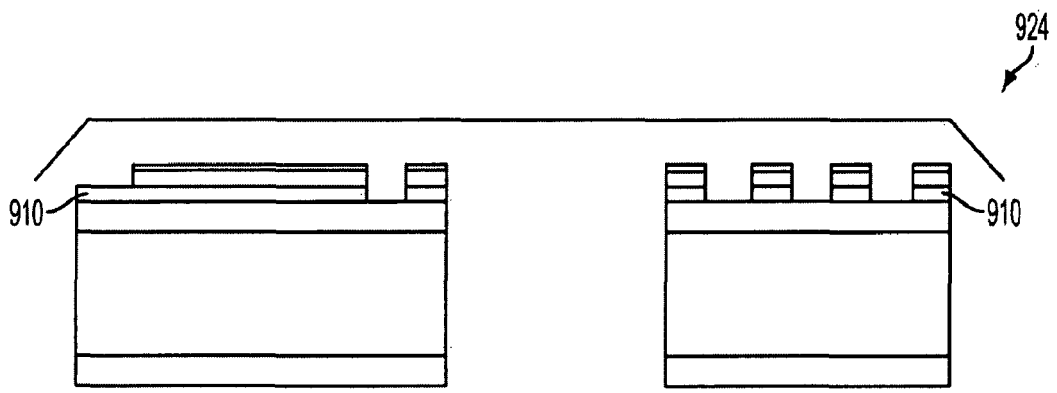
Figure 9I:
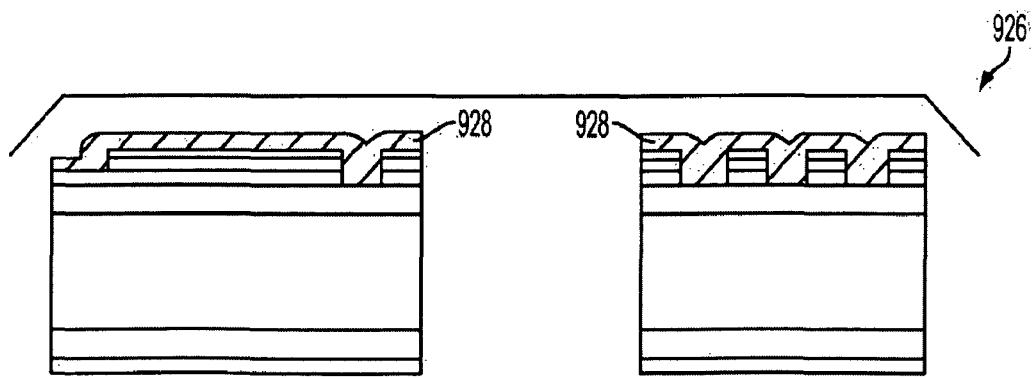
Figure 9J:
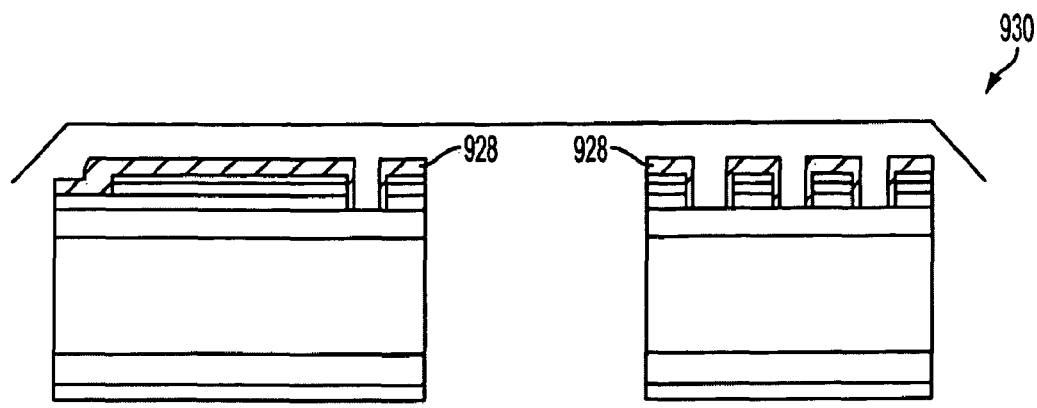
Figure 9K:
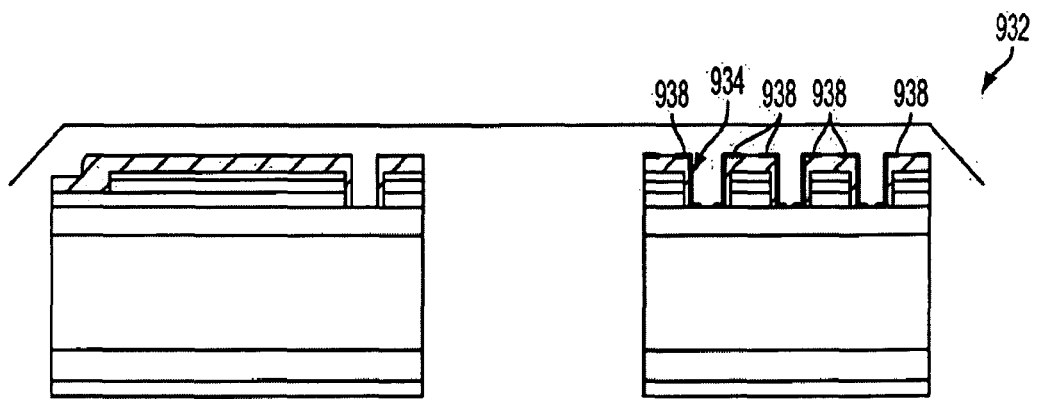
Figure 9L:
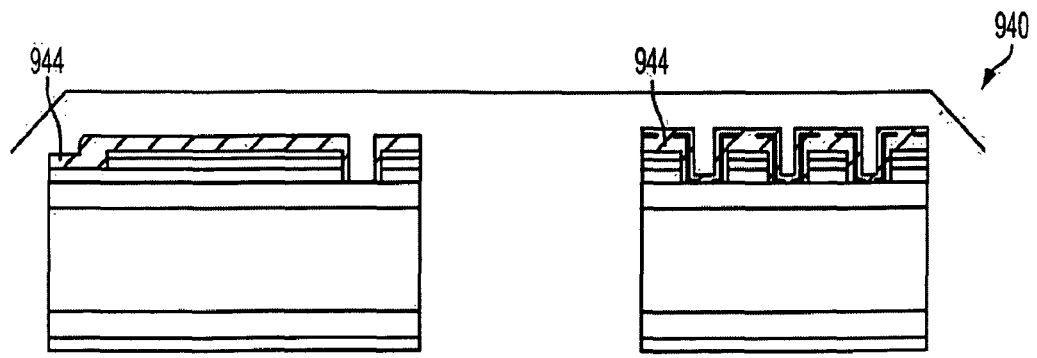
Figure 9M:
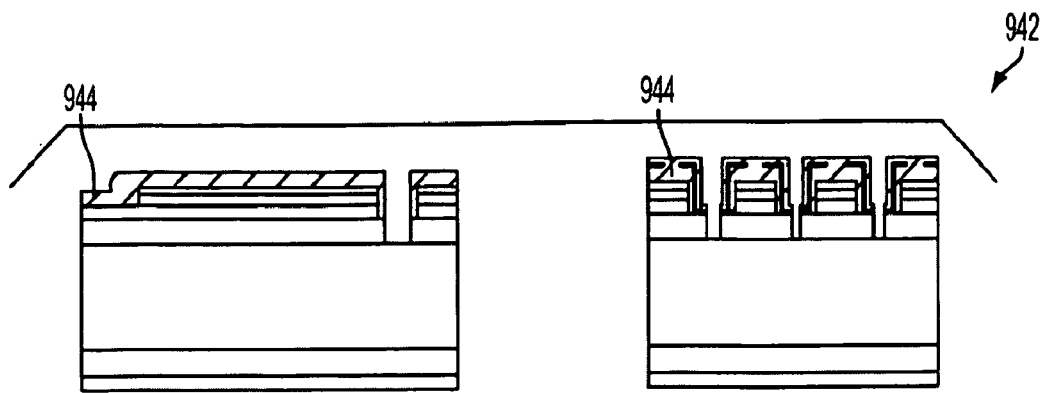
Figure 9N:
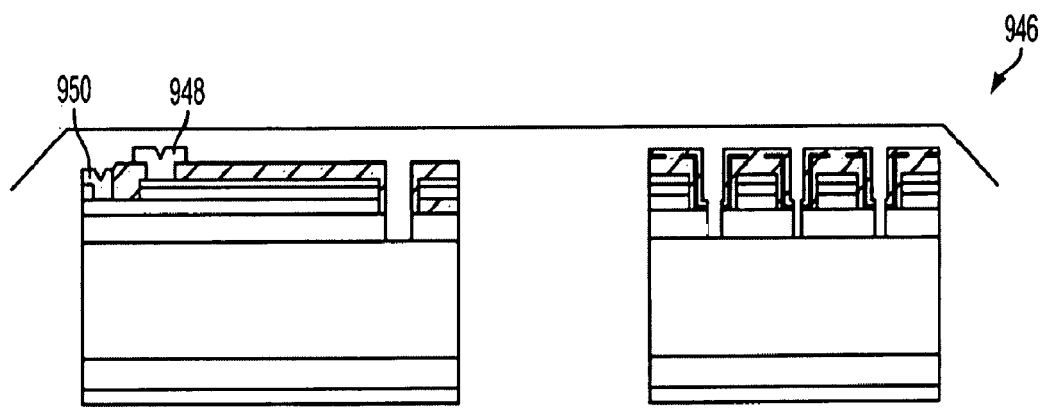
Figure 9O:
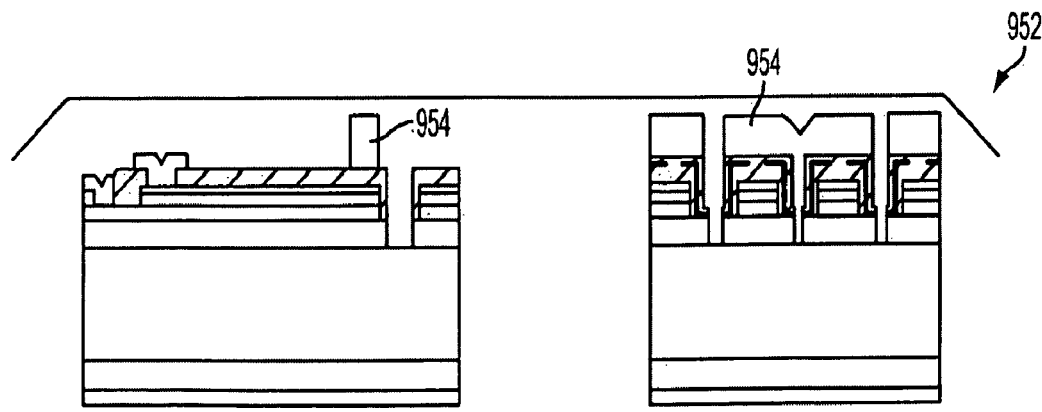
Figure 9P:
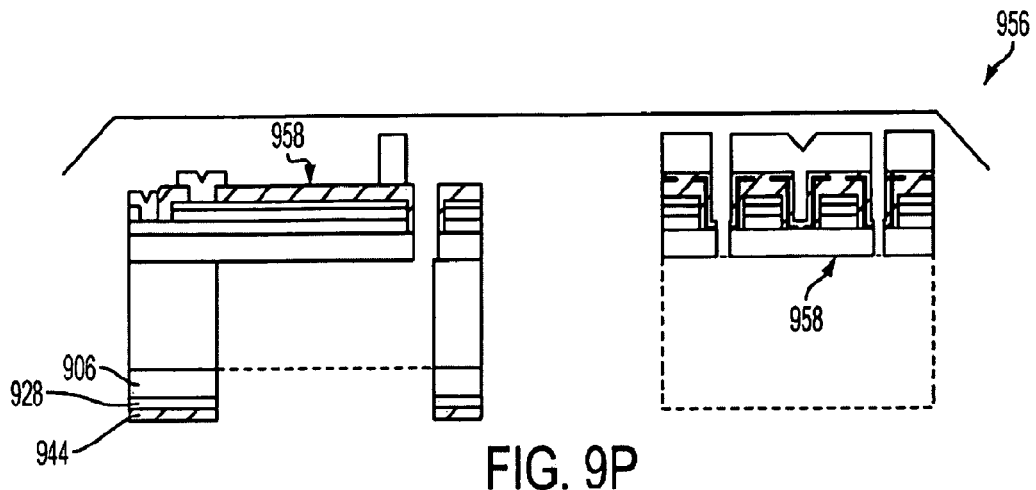

FIGS. 9A-P illustrate steps that can be used to fabricate a microscale cantilever monomorph PME PVEH beam, such as beam 800 of FIG. 8, and indeed an entire microscale PVEH module, such as any one of modules 104A-P of FIGS. 1 and 2. At step 900 (FIG. 9A), a silicon substrate 902 is provided. Silicon substrate 902 may have any crystal orientation and any dopant type and doping concentration. At step 904 (FIG. 9B), a base layer 906 is provided to substrate 902. Base layer 906 corresponds to base layers 828 of FIG. 8, respectively, and, as mentioned above, are used as etch stops for creating the cantilever of beam 800 (FIG. 8). Base layer 906 can be, for example: 1) a grown thermal silicon dioxide ($SiO_2$); 2) a low-pressure chemical vapor deposition (LPCVD) or plasma-enhanced CVD (PECVD) silicon oxide ($SiO_X$, $X</=2$); or a low-stress silicon-rich nitride ($Si_XN_Y$, $X<3$, $Y<4$). Base layer 906 can be provided to both sides of silicon substrate 902 to balance thin-film stress.

At step 908 (FIG. 9C), a metal layer 910 is deposited via sputtering or evaporation on one side of substrate 902. Metal layer 910 corresponds to electrode layer 812 of monomorph beam 800 of FIG. 8. At step 912, a piezoelectric layer 914 is deposited on one side of substrate 902. The piezoelectric material used for this layer 914 may be, for example, any of AlN (deposited by sputtering), lead zirconate titanate (PZT) (deposited via a Sol gel process or sputtering), polyvinylidene fluoride (PVDF) (deposited via a Sol gel process) and zinc oxide (ZnO) (deposited via sputtering). At step 916 (FIG. 9E), a second metal layer 918, corresponding to electrode layer 808 of monomorph beam 800 of FIG. 8, is deposited via sputtering or evaporation.

At step 920 (FIG. 9F), second metal layer 918 is patterned, for example, using photolithographic patterning techniques, and then etched using a wet etch or dry reactive ion etch (RIE). At step 922 (FIG. 9G), piezoelectric layer 914 is etched using a wet etch or dry RIE. If AlN is used for piezoelectric layer 914 and Mo is used for metal layers 910, 918, a wet potassium hydroxide (KOH) process can be used. In this case, the photoresist (not shown) from the patterning of step 920 is stripped prior to the KOH etch and the Mo of metal layers 910, 918 is used as a hard mask. AN etches anisotropically in KOH and forms the angled walls highlighted relative to each of FIGS. 7 and 8, above. At step 924 (FIG. 9H), metal layer 910 is etched using a wet etch or dry RIE. In the Mo example just noted, Mo uses RIE.

At step 926 (FIG. 9I), a first upper dielectric 928, which corresponds to first insulating layer 836 of monomorph beam 800 of FIG. 8, is deposited. Dielectric 928 can be, for example, a deposited LPCVD or PECVD silicon oxide ($SiO_X$) or silicon nitride ($Si_XN_Y$). Typically, metals are not put into an LPCVD furnace due to metal cross-contamination with other products' films. However, it can be done if a dedicated LPCVD system is used and the metal melting point is high (the melting point of tungsten and Mo are high and the melting point of gold is low). In this example, first upper dielectric 928 is deposited on both sides of substrate 902 to balance thin-film stress. At step 930 (FIG. 9J), first upper dielectric 928 is etched using a wet etch or RIE.

If side electrodes, corresponding to side electrodes 840A-D of monomorph beam 800 of FIG. 8 are being provided, optional step 932 (FIG. 9K) can be performed. In step 932, a metal layer 934 is deposited, for example, via sputtering or evaporation, and then patterned and etched to form side electrodes 938. If side electrodes 938 are not provided, step 932 and either steps 926, 930 of FIGS. 9I-J, respectively, or steps 940, 942 of FIGS. 9L-M, respectively, are eliminated. Following the formation of side electrodes 938, if any, steps 940 (FIG. 9L), 942 (FIG. 9M) are performed. At step 940, a second upper dielectric 944, which corresponds to second insulating layer 840 of monomorph beam 800 of FIG. 8, is deposited. Dielectric 944 can be, for example, any one of the materials mentioned above relative to first upper dielectric 928. In this example, second upper dielectric 944 is deposited on both sides of substrate 902 to balance thin-film stress. At step 942 (FIG. 9M), second upper dielectric 944 is etched using a wet etch or RIE.

At step 946 (FIG. 9N), electrical contacts 948, 950 and interconnecting wiring (not shown) are provided. Typically, though not necessarily, electrical contacts 948, 950 will be aluminum with about 2% silicon to inhibit electro-migration due to electrical current flow. Contacts 948, 950 and wiring may be provided, for example, by either a photo metal deposition (evaporation) lift-off process or by deposition (evaporation and sputtering) and wet etch or RIE. At step 952 (FIG. 9O), a proof mass 954 is formed using a suitable method. Generally, electroplating is the best method for achieving thick metal depositions in the range of about 10 μm to about 100 μm. Evaporation is limited to thicknesses less than about 3 μm.

At step 956 (FIG. 9P), the precursor to cantilever beam 958 is released from substrate 902 to form the cantilever. In this example, cantilever beam 958 is formed using a backside release method that involves patterning and etching through second and first dielectrics 944, 928 and backside base layer 906 and then performing a deep RIE (DRIE) through substrate 902 to the underside of the frontside base layer.

Figure 10A:
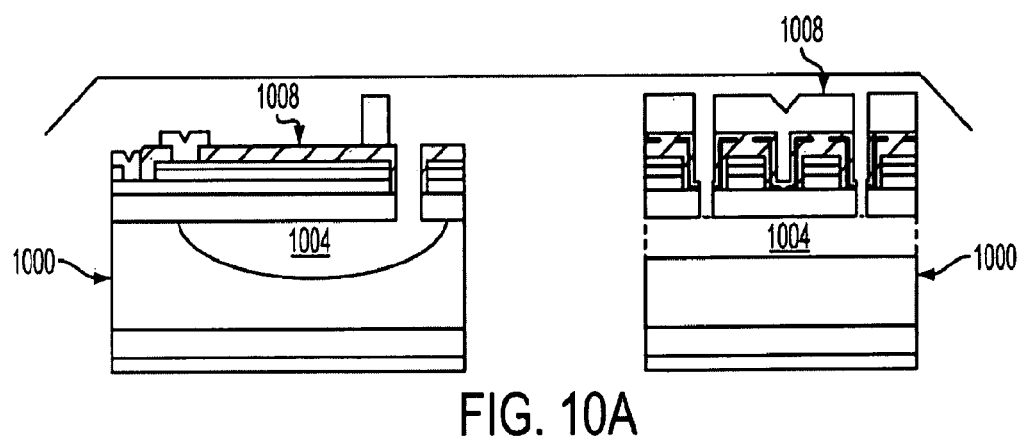
FIGS. 10A-B are a series of diagrams illustrating alternative steps that can be used to make a monomorph PME PVEH beam, wherein each of FIGS. 10A-B contains a transverse cross-sectional view and a transverse cross-sectional view relative to the finished beam.
Figure 10B:
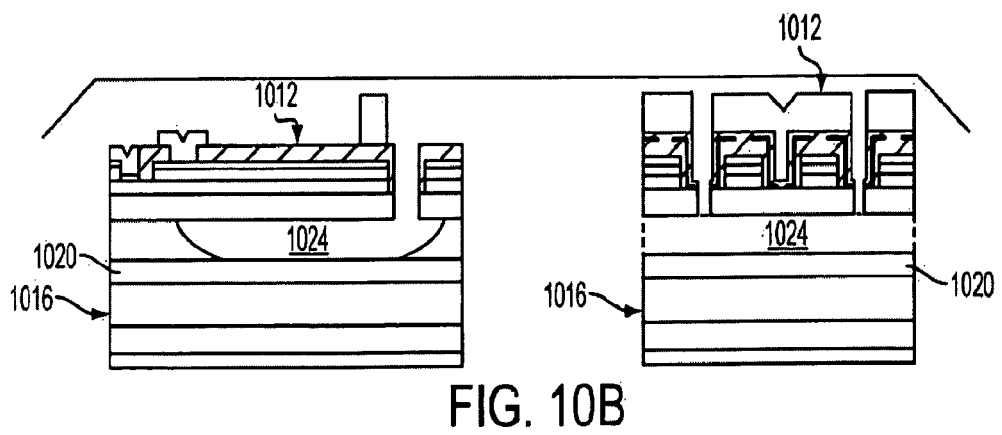

FIGS. 10A-B illustrate two alternative methods of releasing the precursor structure to the cantilever beam, both involving etching from the front side of the assembly, rather than from the backside as just described relative to FIG. 9P. In FIG. 10A, a silicon isotropic etch is performed from the front side of the assembly 1000 to form a cavity 1004 beneath cantilever beam 1008. For example, a fluorine-based etchant, such as gaseous xenon fluoride ($XeF_2$) or sulfur Hexafluoride ($SF_6$), that etches silicon isotropically but does not attack other material may be used. In this type of method, cavity 1004 may limit up-and-down movement of the free end of cantilever beam 1008, but the cavity provides isolation for wafer-scale packaging and a bottom stop that can be useful in preventing over-flexing (over-straining) of the beam. In this case, some upward curl due to asymmetric may be desirable for "tuning" the range of motion of the free end of cantilever beam 1008.

FIG. 10B illustrates another frontside method of releasing the precursor to the cantilever beam 1012. In this method, instead of substrate 902 (FIG. 9A) being a conventional non-silicon-on-insulator (non-SOI) substrate, an SOI substrate 1016 having a buried oxide (BOX) layer 1020 can be used. In this method, BOX layer 1020 acts as an etch stop to precisely control the depth of the cavity 1024 formed during isotropic etching from the front side of SOI substrate 1016. As with the method of FIG. 10A, a fluorine-based etchant, such as gaseous $XeF_2$ or $SF_6$, that etches silicon isotropically but does not attack other material may be used. Here, too, some upward curl due to asymmetric may be desirable for "tuning" the range of motion of the free end of cantilever beam 1012.

While the fabrication techniques of FIGS. 9A-P and 10A-B are directed to making monomorph beams 958, 1008, 1012, these techniques can be readily extended for producing bimorph beams similar to bimorph beam 600 of FIGS. 6 and 7. For example, rather than patterning and etching second metal layer 918, first piezoelectric layer 914 and first metal layer 910 at steps 920, 922, 924 of FIGS. 9F-H, just after the deposition of the second metal layer at step 916 (FIG. 9E), instead a second piezoelectric layer (not shown, but corresponding to piezoelectric layer 700 of FIG. 7) and a third metal layer (also not shown, but corresponding to electrode layer 712 of FIG. 7) can be deposited on the second metal layer before continuing with the deposition of first upper dielectric 928, as in step 926 of FIG. 9I. Then, the etching starts with the third metal layer and proceeds down to, and includes, first metal layer 910. During this process, it may be desirable to alter the thicknesses of upper dielectrics 944, 928 and base layer 906 to balance stresses and control curling as desired or necessary.

Figure 11:
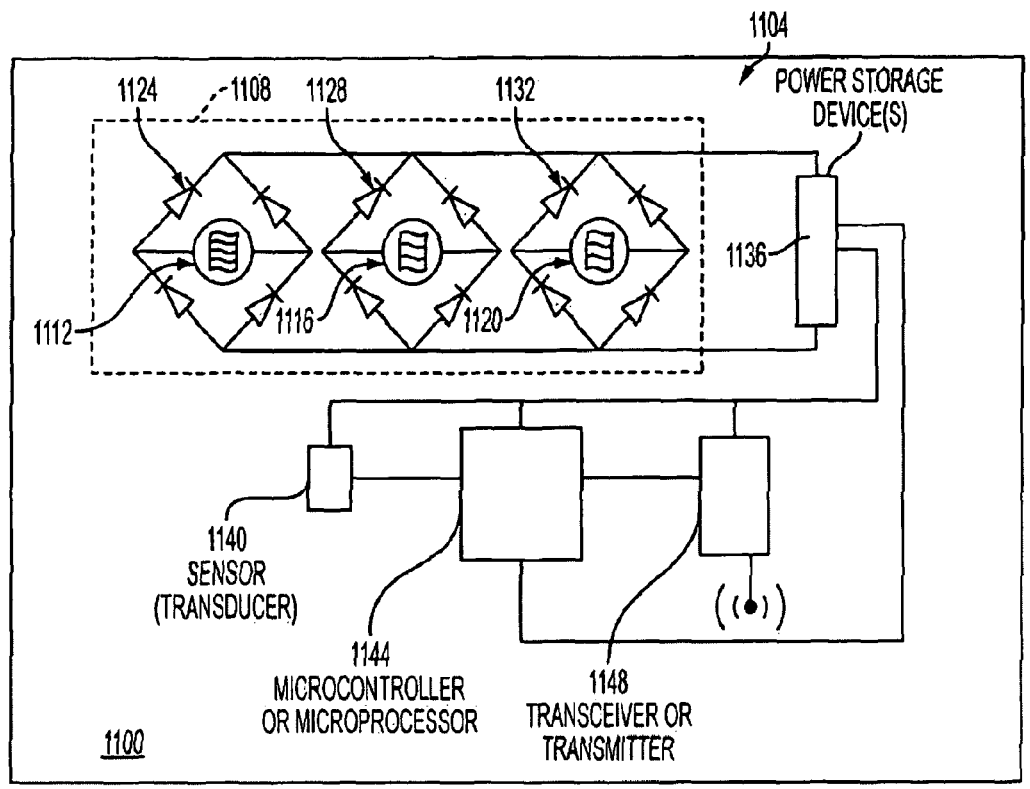
FIG. 11 is a schematic/diagrammatic view of a wireless sensor made in accordance with concepts of the present disclosure.

As mentioned above, a PVEH unit made in accordance with concepts disclosed above may be used in any of a variety of applications, including wireless sensor applications. FIG. 11 illustrates an exemplary wireless sensor 1100 that comprises a standalone power supply 1104 that includes a PVEH unit 1108 that is generally of similar construction to PVEH unit 100 of FIG. 1. That is, PVEH unit 1108 includes a plurality of groups (not shown) of PME beams (not shown). Although not shown, the groups may, but need not necessarily be laid out similar to groups 200A-E of FIG. 2A and each of the PME beams may be, for example, similar to bimorph beam 600 shown in FIGS. 6 and 7 or monomorph beam 800 shown in FIG. 8. In this example, PVEH unit 1108 has PME beams having three differing tunings tuned in the manner described above relative to FIGS. 4 and 5 so as to broaden the effective bandwidth of the PVEH unit around a target frequency. In FIG. 11, the like-tuned beams are identified as a first set 1112, a second set 1116 and a third set 1120, and the sets have corresponding respective differing fundamental resonance frequencies $V_{B1}$, $V_{B2}$, $V_{B2}$ and corresponding respective differing parametric mode frequencies $V_{P1}$, $V_{P2}$, $V_{P2}$.

To optimize the performance of power supply 1104, sets 1112, 1116, 1120 of like-tuned beams are electrically isolated from one another using suitable isolation circuitry, such as, for example, corresponding respective full-bridge rectifiers 1124, 1128, 1132 (here, diode rectifiers as an example) that inhibit any inactive set(s) (e.g., because they are not sufficiently excited by the ambient driving vibration) from draining electrical power from the active set(s). In this manner, the maximum amount of power is output from PVEH unit 1108. Those skilled in the art will understand that other isolation circuitry may be used. Power supply 1104 also includes one or more electrical storage devices 1136 that store electrical energy scavenged by PVEH unit 1108 for use by other electronics aboard wireless sensor. Each electrical storage device 1136 may be any suitable rechargeable device, such as a super-capacitor (also "ultra-capacitor") or a rechargeable battery, for example, and lithium-ion battery, among others. In this example, power supply 1104 has only a single PVEH unit 1108 for scavenging vibration from a driving ambient vibration in one direction. It is noted that one or more additional, like PVEH units (not shown) could be provided in one or more differing orientations for scavenging vibrations in another direction.

In this example, wireless sensor 1100 includes one or more transducers 1140, such as a pressure transducer, accelerometer, temperature probe, etc., as the application for the wireless sensor requires. Wireless sensor 1100 further includes a microcontroller 1144 for controlling the operation of the wireless sensor and a radio transmitter or transceiver 1148 for allowing the wireless sensor to communicate with one or more other devices, such as another like wireless sensor, a repeater, an information collection node device or a base-station device, among others. In addition to or in place of microcontroller 1144, wireless sensor 1100 may include one or more microprocessors that provide the wireless sensor with higher level data processing functionality, if desired. In this embodiment, power supply 1104 provides electrical power to each transducer 1140, microcontroller 1144 (or microprocessor) and transceiver 1148. Those skilled in the art will understand that each transducer 1140, microcontroller 1144 (or microprocessor) and transceiver 1148 can be of a conventional design and, therefore, need not be described in detail herein.

Figure 12:
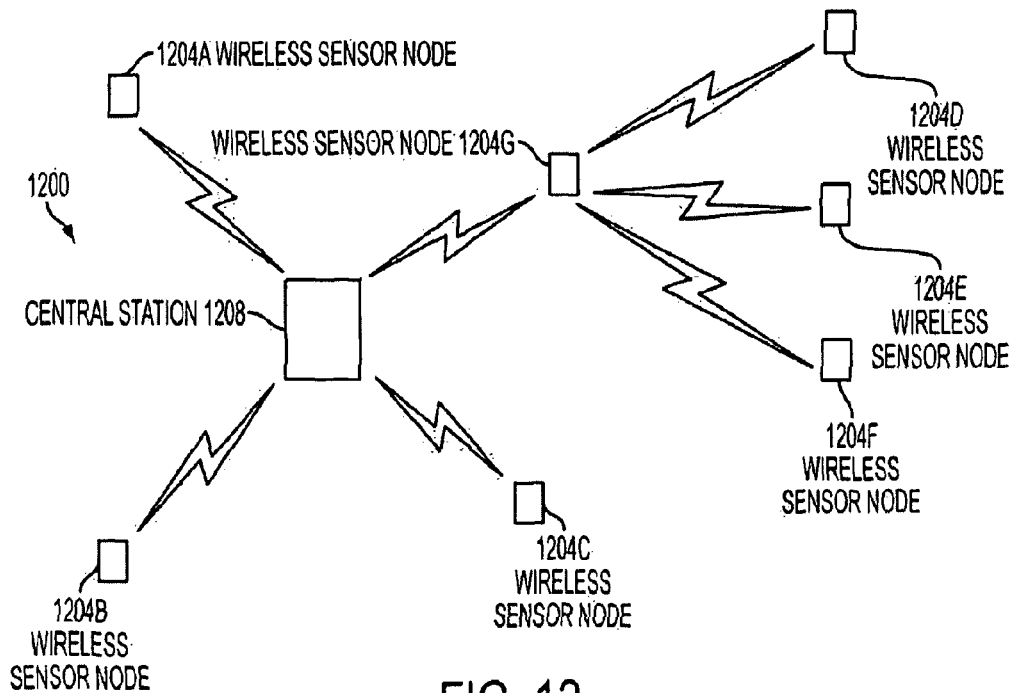
FIG. 12 is a block diagram of a network of wireless sensors each utilizing a PME-based power source for powering each onboard sensor and communications within the network.

FIG. 12 illustrates a wireless sensor network 1200 that includes a plurality of sensor nodes 1204A-G and a central station 1208. Each of sensor nodes 1204A-G in this example includes a standalone PME PVEH power supply (not shown) and is similar to wireless sensor 1100 of FIG. 11. In this example, sensor nodes 1204A-F may be considered terminal nodes, whereas sensor node 1204G may be considered an intermediate node. In this context, a terminal node generally only collects its own sensed data and transmits it to either another node (such as intermediate sensor 1204G) or central station 1208. Depending on whether the network is of a push type or a pull type (and/or for other reasons) a terminal node may also receive information, such as a pull request, from central station 1208 or another node, such as intermediate sensor 1204G. Intermediate sensor 1204G, on the other hand is continually both receiving data, here from sensor nodes 1204D-F, and sending data to central station 1208. Those skilled in the art will readily understand how to configure sensor nodes 1204A-G and central station 1208 for proper operation in the context of the sensors nodes having PME PVEH units of the present disclosure.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A vibrational energy harvester, comprising:
a resonator beam having transverse cross-sectional flexural properties, a fundamental resonance frequency in a first bending direction that is a function of said transverse cross-sectional flexural properties and a parametric mode frequency in a second bending direction perpendicular to said first bending direction, wherein said parametric mode frequency is a function of said transverse cross-sectional flexural properties and said transverse cross-sectional flexural properties are selected to tune said fundamental resonance frequency to a first desired frequency and to tune said parametric mode frequency to a second desired frequency, said resonant beam including piezoelectric material for generating electrical energy in response to bending of said resonator beam in each of said first and second bending directions when said resonator beam is vibrating at said first desired frequency and said second desired frequency.

2. A vibrational energy harvester according to claim 1, wherein said resonator beam has a length and said piezoelectric material is disposed along said length in a manner that said piezoelectric material contributes to said transverse cross-sectional flexural properties.

3. A vibrational energy harvester according to claim 2, wherein said resonator beam has a first bending axis for said first bending direction and a second bending axis for said second bending direction, said first and second bending axes defining first, second, third and fourth quadrants such that said first and second quadrants are opposite one another on opposite sides of said first bending axis and said second and third quadrants are opposite one another on opposite sides of said second bending axis, said resonator beam further including first, second, third and fourth electrodes spaced from one another and located in corresponding respective ones of said first, second, third and fourth quadrants.

4. A vibrational energy harvester according to claim 3, wherein a first portion of said piezoelectric material is located between said first and second electrodes and a second portion of said piezoelectric material is located between said third and fourth electrodes.

5. A vibrational energy harvester according to claim 4, wherein said first and second portions of said piezoelectric material are spaced from one another on opposite sides of said first bending axis.

6. A vibrational energy harvester according to claim 5 further comprising:
fifth and sixth electrodes located on opposing sides of said first portion of said piezoelectric material and each located in both of said first and second quadrants; and
seventh and eighth electrodes located on opposing sides of said second portion of said piezoelectric material and each located in both of said third and fourth quadrants.

7. A vibrational energy harvester according to claim 3, wherein each of said first, second, third and fourth electrodes is disposed along said length of said resonator beam in a manner that each of said first, second, third and fourth electrodes contributes to said transverse cross-sectional flexural properties.

8. A vibrational energy harvester according to claim 3, further comprising a fifth electrode located between, and spaced from, said first and second electrodes, and a sixth electrode located between, and spaced from said third and fourth electrodes, wherein a first portion of said piezoelectric material is located between said first and fifth electrodes, a second portion of said piezoelectric material is located between said fourth and sixth electrodes, a third portion of said piezoelectric material is located between said fifth and second electrodes and a fourth portion of said piezoelectric material is located between said sixth and third electrodes.

9. A vibrational energy harvester according to claim 8, wherein said first and second portions are spaced from one another and said third and fourth portions are spaced from one another on opposite sides of said first bending axis.

10. A vibrational energy harvester according to claim 9 further comprising:
seventh and eighth electrodes located on opposing sides of said first and second portions of said piezoelectric material and each located in both of said first and second quadrants; and
ninth and tenth electrodes located on opposing sides of said third and fourth portions of said piezoelectric material and each located in both of said third and fourth quadrants.

11. A vibrational energy harvester according to claim 8, wherein each of said fifth and sixth electrodes straddles said first bending axis.

12. A vibrational energy harvester according to claim 8, further including harvesting circuitry in electrical communication with each of said first, second, third, fourth, fifth and sixth electrodes and configured for harvesting said electrical energy from each of said first, second, third and fourth quadrants independently of one another.

13. A vibrational energy harvester according to claim 8, wherein each of said fifth and sixth electrodes is disposed along said length of said resonator beam in a manner that each of said fifth and sixth electrodes contributes to said transverse cross-sectional flexural properties.

14. A vibrational energy harvester according to claim 2, wherein said resonator beam is a cantilever beam.

15. A vibrational energy harvester according to claim 2, wherein said fundamental resonance frequency is in a range of 30 Hz to 1500 Hz.

16. A vibrational energy harvester according to claim 15, wherein said fundamental resonance frequency is in a range of 30 Hz to 250 Hz.

17. A vibrational energy harvester according to claim 15, wherein said fundamental resonance frequency is 100 Hz±10 Hz.

18. A vibrational energy harvester according to claim 15, wherein said fundamental resonance frequency is 120 Hz±10 Hz.

19. A vibrational energy harvester according to claim 2, wherein said transverse cross-sectional properties of said resonator beam are selected so that said parametric mode frequency falls in a range of said fundamental resonance frequency and 8 times said fundamental resonance frequency.

20. A vibrational energy harvester according to claim 19, wherein said transverse cross-sectional properties of said resonator beam are selected so that said parametric mode frequency falls in a range of greater than said fundamental resonance frequency and less than 1.2 times said fundamental resonance frequency.

21. A vibrational energy harvester according to claim 2, wherein said transverse cross-sectional properties include a width in a direction parallel to said first bending direction and a thickness in a direction parallel to said second bending direction, wherein said width is in a range of said thickness to 8 times said thickness.

22. A vibrational energy harvester according to claim 21, wherein said width is in a range of 1 to 3 times said thickness.

23. A vibrational energy harvester, comprising:
a group of parametric mode enabled (PME) piezoelectric vibrational energy harvesting (PVEH) beams all configured to harvest electrical charge from specific fundamental and parametric mode resonant frequencies.

24. A vibrational energy harvester according to claim 23, wherein each of said PME PVEH beams has a parametric mode bending neutral axis and includes first and second piezoelectric/electrode stacks located on opposite sides of said parametric mode bending neutral axis.

25. A vibrational energy harvester according to claim 24, wherein said first piezoelectric/electrode stack includes a first plurality of electrodes and said second piezoelectric/electrode stack includes a second plurality of electrodes spaced from said first plurality of electrodes across said parametric mode bending neutral axis.

26. A vibrational energy harvester according to claim 24, wherein each of said PME PVEH beams is a bimorph piezoelectric beam.

27. A vibrational energy harvester according to claim 23, comprising a plurality of groups of PME PVEH beams having corresponding respective differing tunings, wherein said differing tunings include different fundamental resonance frequencies and different parametric mode frequencies.

28. A vibrational energy harvester according to claim 27, wherein ones of said different fundamental resonance frequencies differ by less than 25 Hz from any immediately adjacent one of said different fundamental resonance frequencies.

29. A vibrational energy harvester according to claim 28, wherein ones of said different parametric mode frequencies differ by less than 25 Hz from corresponding respective ones of said different fundamental resonance frequencies.

30. A vibrational energy harvester according to claim 23, wherein each of said plurality of PME PVEH beams has a fundamental resonance frequency and a parametric mode frequency within 25 Hz of said fundamental resonance frequency.

31. A vibrational energy harvester according to claim 23, comprising a plurality of groups of parallel PME PVEH beams, wherein said parallel PME PVEH beams in a first group of said plurality of groups have longitudinal axes extending in a first direction and said parallel PME PVEH beams in a second group of said plurality of groups have longitudinal axes extending in a second direction substantially perpendicular to said first direction so as to make the vibrational energy harvester a 3-axis vibrational energy harvester.

32. A vibrational energy harvester, comprising:
a plurality of differing groups of parametric mode enabled (PME) piezoelectric vibrational energy harvesting (PVEH) beams, wherein said differing groups are configured to harvest electrical charge from corresponding respective differing sets of fundamental and parametric mode resonant frequencies.

33. A vibrational energy harvester according to claim 32, wherein ones of said fundamental resonance frequencies in said differing sets differ by less than 25 Hz from said fundamental resonance frequency in any immediately adjacent one of said differing sets.

34. A vibrational energy harvester according to claim 33, wherein ones of said parametric mode frequencies in said differing sets differ by less than 25 Hz from corresponding respective ones of said different fundamental resonance frequencies in said differing sets.

35. A vibrational energy harvester according to claim 32, wherein each of said plurality of PME PVEH beams has a fundamental resonance frequency and a parametric mode frequency within 25 Hz of said fundamental resonance frequency.

36. A vibrational energy harvester according to claim 32, wherein each of said PME PVEH beams has a parametric mode bending neutral axis and includes first and second piezoelectric/electrode stacks located on opposite sides of said parametric mode bending neutral axis.

37. A vibrational energy harvester according to claim 36, wherein said first piezoelectric/electrode stack includes a first plurality of electrodes and said second piezoelectric/electrode stack includes a second plurality of electrodes spaced from said first plurality of electrodes across said parametric mode bending neutral axis.

* * * * *